(12) United States Patent
Ray

(10) Patent No.: US 11,444,643 B2
(45) Date of Patent: Sep. 13, 2022

(54) SIGNAL FREQUENCY AND BANDWIDTH ESTIMATION USING A LEARNED FILTER PAIR RESPONSE

(71) Applicant: The Boeing Company, Chicago, IL (US)

(72) Inventor: Gary A. Ray, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 297 days.

(21) Appl. No.: 16/858,960

(22) Filed: Apr. 27, 2020

(65) Prior Publication Data

US 2021/0336644 A1 Oct. 28, 2021

(51) Int. Cl.
*H04B 1/10* (2006.01)
*H03H 17/02* (2006.01)
(Continued)

(52) U.S. Cl.
CPC .......... *H04B 1/1027* (2013.01); *G01R 23/02* (2013.01); *H03H 11/1291* (2013.01); *H03H 17/0294* (2013.01); *H04B 1/0025* (2013.01)

(58) Field of Classification Search
CPC ...... G01S 7/023; G01S 13/90; G01S 13/0209; G01S 13/003; G01S 13/931; G01S 7/292; G01S 7/354; G01S 13/88; G01S 7/36; G01S 7/038; G01S 7/2813; G01S 7/358; G01S 13/343; G01S 7/356; G01S 7/414; G01S 13/5244; G01S 13/9092; G01S 17/10; G01S 7/4021; G01S 7/403; G01S 7/4034; G01S 7/4065; G01S 7/4069; G01S 7/4078; G01S 13/87; H04B 1/123; H04B 1/0028; H04B 1/109; H04B 1/38; H04B 1/71632; H04B 17/345; H04B 1/525; H04B 1/56; H04B 7/0617; H04B 1/1036; H04B 1/719; H04B 15/00; H04B 7/0822; H04B 1/69; H04L 27/2649; H04L 27/0004; H04L 27/265; H04L 25/0204; H04L 25/03006;
(Continued)

(56) References Cited

U.S. PATENT DOCUMENTS 9,866,422 B1 1/2018 Ray
9,954,561 B2 4/2018 Ray et al.
(Continued)

*Primary Examiner* — Golam Sorowar
(74) *Attorney, Agent, or Firm* — Ostrager Chong Flaherty & Broitman P.C.

(57) ABSTRACT

Systems and methods for estimating frequency and bandwidth of unknown signals using learned features of a filter pair for the purpose of detecting, separating and tracking these signals in an electronic receiver. The techniques could be part of a signal cueing system that initiates signal detection, separation and tracking or a signal separation and tracking system which is initialized by the cueing system and adaptively updates frequency and bandwidth estimates so as to continuously separate and track signals after initial detection. The methodology is to train the filter responses using machine learning by creating a grid of training data based on signal examples that cover a span of frequencies and bandwidths. The system estimates frequency and bandwidth in real time, inputs those estimates into interpolating lookup tables to retrieve filter coefficients, and provides those filter coefficients to a tunable tracking filter.

20 Claims, 10 Drawing Sheets

(51) Int. Cl.
*H03H 11/12* (2006.01)
*H04B 1/00* (2006.01)
*G01R 23/02* (2006.01)

(58) Field of Classification Search
CPC . H04L 25/0328; H04L 25/08; H04L 27/2651; H04L 27/2657; H04L 27/2676; H04L 27/2688; H04L 47/29; H04L 5/14; H04L 5/1461; H04L 27/264; H04L 27/26414; H04L 27/26538; H03H 21/003; H03H 17/0628; H03H 17/0263; H03H 2021/0034; H03H 21/0025; H03H 17/0261; H03H 21/0067
See application file for complete search history.

(56) References Cited

U.S. PATENT DOCUMENTS

| | | | |
|---|---|---|---|
| 10,429,491 B2 | 10/2019 | Ray et al. | |
| 2018/0083656 A1* | 3/2018 | Ray | H04B 1/0053 |
| 2019/0052237 A1* | 2/2019 | Andrei | H03F 3/68 |
| 2021/0014092 A1* | 1/2021 | Marcoux | G06K 9/6276 |

* cited by examiner

SIGNAL FREQUENCY AND BANDWIDTH ESTIMATION USING A LEARNED FILTER PAIR RESPONSE

BACKGROUND

The technology disclosed herein generally relates to methods and apparatus for detecting and classifying repetitive signals and, in particular, relates to signal detection, separation, and tracking of repetitive signals in a wideband receiver.

A receiver system is any system configured to receive and process electromagnetic radiation to identify information carried by the electromagnetic radiation. Typically, a receiver system includes a transducer and a receiver. The transducers used in a receiver system are typically configured to convert received electromagnetic radiation into an analog electrical signal (e.g., antennas). A receiver processes the analog electrical signal generated by the transducer to obtain information about an unknown signal carried by the electromagnetic radiation.

Oftentimes, electromagnetic radiation is used to carry repetitive signals. A repetitive signal is a signal that has a time period over which some aspect of the signal repeats. Repetitive signals are used in timing, synchronization, radar, sonar, and other operations. For example, the characteristics of a repetitive signal may be used to synchronize two or more devices.

In some situations, a receiver system may receive electromagnetic radiation carrying an unknown repetitive signal, but may be unable to identify desired information about the repetitive signal. For example, the receiver system may be unable to detect and/or classify the repetitive signal. Classifying a repetitive signal may include estimating the frequency and bandwidth of the repetitive signal.

Previous typical solutions to the problem of frequency and bandwidth estimation of unknown signals carried by detected electromagnetic radiation involved using either a Fourier transform together with backend signal detection and estimation processing (a non-real time methodology with high latency) or signal energy estimates from three or more filters (which is typically not very accurate unless the signal is observed for long periods of time). What is needed is a fast and accurate real-time method that can act to direct a signal tracking filter for signal separation and tracking with low latency.

SUMMARY

The subject matter disclosed in some detail below is directed to systems and methods for estimating frequency and bandwidth of unknown signals in detected electromagnetic radiation using the learned features of a filter pair (hereinafter "learned filter pair responses) for the purpose of detecting, separating and tracking these signals in an electronic receiver. These unknown signals could be either radar or communications signals. The techniques could be part of a signal cueing system that initiates signal detection, separation and tracking. Or it could be part of a blind source separation system which is initialized by the cueing system and adaptively updates frequency and bandwidth estimates so as to continuously separate and track signals after initial detection.

The methodology is to train the filter responses using machine learning by creating a grid of training data based on signal examples that cover a span of frequencies and bandwidths. The methodology uses the complex characteristics of a pair of Infinite Impulse Response filters (hereinafter "IIR filters") and their non-constant group delay to perform accurate frequency and bandwidth estimation even in the presence of considerable amounts of signal noise and to make these estimates in real time with low latency. The low-latency estimates enable a filter with the matching frequency and bandwidth to be instantly generated and the signal filtered from that point on. Accordingly, the signal is noise reduced and separated before it has gone away, enabling low-latency real-time operation. Thus, the proposed system and method enable both noise reduction and signal separation.

The proposed system and method perform real-time estimation of signal frequency and bandwidth that is both accurate and fast using only two filters having partially overlapping frequency bands. Previous methods typically involved estimates of signal energy among three or more filters that required tracking over time to resolve these estimates and thus required higher SNR and a longer period of time.

The system proposed herein takes an incoming signal embedded in noise and both reduces the noise and separates out the signal from a given input bandwidth. The system does this by estimating frequency and bandwidth in real time, inputting the frequency and bandwidth estimates into a plurality of two-dimensional (2-D) interpolating lookup tables (one table for each filter coefficient) to retrieve values for respective filter coefficients, and then providing the retrieved filter coefficient values to a tunable tracking filter. The filter coefficient lookup table may be implemented on a field-programmable gate array (FPGA) or application-specific integrated circuit (ASIC).

Although various embodiments of systems and methods for estimating frequency and bandwidth of unknown signals using a learned filter pair response will be described in some detail below, one or more of those embodiments may be characterized by one or more of the following aspects.

One aspect of the subject matter disclosed in detail below is a method for estimating frequency and bandwidth of signals, the method comprising: transducing electromagnetic radiation carrying a repetitive signal into an analog electrical signal; converting the analog electrical signal into signal samples; inputting the signal samples to first and second filters having partially overlapping bandwidths that include a frequency range bounded by lower- and upper-bound frequencies and having a center frequency; outputting first filtered signal samples from the first filter and second filtered signal samples from the second filter in response to inputting the digital signal samples; and processing the first and second filtered signal samples to generate frequency/bandwidth digital data representing an estimated frequency and an estimated bandwidth of the repetitive signal. The first fixed filter has a center frequency equal to the lower-bound frequency and the second fixed filter has a center frequency equal to the upper-bound frequency.

In accordance with one embodiment of the method described in the immediately preceding paragraph, the method further comprises: generating filter coefficients for a tunable filter which are functions of the estimated frequency and the estimated bandwidth; tuning the tunable filter in accordance with the filter coefficients; inputting the signal samples to the tunable filter after tuning; outputting filtered signal samples from the tunable filter after tuning and in response to inputting the digital signal samples.

Another aspect of the subject matter disclosed in detail below is a system for processing repetitive signals, the system comprising: a sensor configured to transduce electromagnetic radiation carrying a repetitive signal into an analog electrical signal; an analog-to-digital converter configured to convert the analog electrical signal into signal samples; a signal frequency/bandwidth estimator comprising first and second filters connected to receive the signal samples and signal processing circuitry configured to process filtered signal samples from the first and second filters to generate frequency/bandwidth digital data representing an estimated frequency and an estimated bandwidth of the repetitive signal; and a signal separation and tracking channel comprising a tunable filter connected to receive the signal samples and configured to filter the signal samples using filter coefficients which are a function of the estimated frequency and estimated bandwidth, wherein the first and second filters have partially overlapping bandwidths that include a frequency range bounded by lower- and upper-bound frequencies and having a center frequency. The first fixed filter has a center frequency equal to the lower-bound frequency and the second fixed filter has a center frequency equal to the upper-bound frequency.

In accordance with one embodiment of the system described in the immediately preceding paragraph, the signal processing circuitry comprises: a feature vector computation module configured to compute first through fourth feature vectors based on first and second filtered signal samples respectively out by the first and second filters; a first 2-D lookup table which is connected to receive the first and second feature vectors from the feature vector computation module and configured to store frequency offsets and output an interpolated frequency offset based on the first and second feature vectors; a first adder connected to add the center frequency to an interpolated frequency offset output by the first 2-D lookup table to generate an estimated lower frequency; a second 2-D lookup table which is connected to receive the third and fourth feature vectors from the feature vector computation module and configured to store frequency offsets and output an interpolated frequency offset based on the third and fourth feature vectors; a second adder connected to add the center frequency to an interpolated frequency offset output by the second 2-D lookup table to generate an estimated upper frequency; a third 2-D lookup table which is connected to receive the first and second feature vectors from the feature vector computation module and configured to store bandwidths and output an interpolated bandwidth based on the first and second feature vectors; a fourth 2-D lookup table which is connected to receive the third and fourth feature vectors from the feature vector computation module and configured to store bandwidths and output an interpolated bandwidth based on the third and fourth feature vectors; and a decision circuit that selects one of the estimated lower and upper frequencies and an associated estimated depending on whether a windowed sum squared of the output of the first filter is less or more than a windowed sum squared of the output of the second filter.

A further aspect of the subject matter disclosed in detail below is a signal cueing system comprising: first and second filters connected to receive signal samples of a repetitive signal and configured to output filtered signal samples, wherein the first and second filters have partially overlapping bandwidths that include a frequency range bounded by lower- and upper-bound frequencies and having a center frequency; and signal processing circuitry configured to process filtered signal samples from the first and second filters to generate frequency/bandwidth digital data representing an estimated frequency and an estimated bandwidth of the repetitive signal.

In accordance with one embodiment of the system described in the immediately preceding paragraph, the signal processing circuitry comprises: a feature vector computation module configured to compute first through fourth feature vectors based on first and second filtered signal samples respectively out by the first and second filters; a first 2-D lookup table which is connected to receive the first and second feature vectors from the feature vector computation module and configured to store frequency offsets and output an interpolated frequency offset based on the first and second feature vectors; a first adder connected to add the center frequency to an interpolated frequency offset output by the first 2-D lookup table to generate an estimated lower frequency; a second 2-D lookup table which is connected to receive the third and fourth feature vectors from the feature vector computation module and configured to store frequency offsets and output an interpolated frequency offset based on the third and fourth feature vectors; a second adder connected to add the center frequency to an interpolated frequency offset output by the second 2-D lookup table to generate an estimated upper frequency; a third 2-D lookup table which is connected to receive the first and second feature vectors from the feature vector computation module and configured to store bandwidths and output an interpolated bandwidth based on the first and second feature vectors; a fourth 2-D lookup table which is connected to receive the third and fourth feature vectors from the feature vector computation module and configured to store bandwidths and output an interpolated bandwidth based on the third and fourth feature vectors; and a decision circuit that selects one of the estimated lower and upper frequencies and an associated estimated depending on whether a windowed sum squared of the output of the first filter is less or more than a windowed sum squared of the output of the second filter.

Other aspects of systems and methods for estimating frequency and bandwidth of unknown signals using a learned filter pair response are disclosed and claimed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Figure 1:
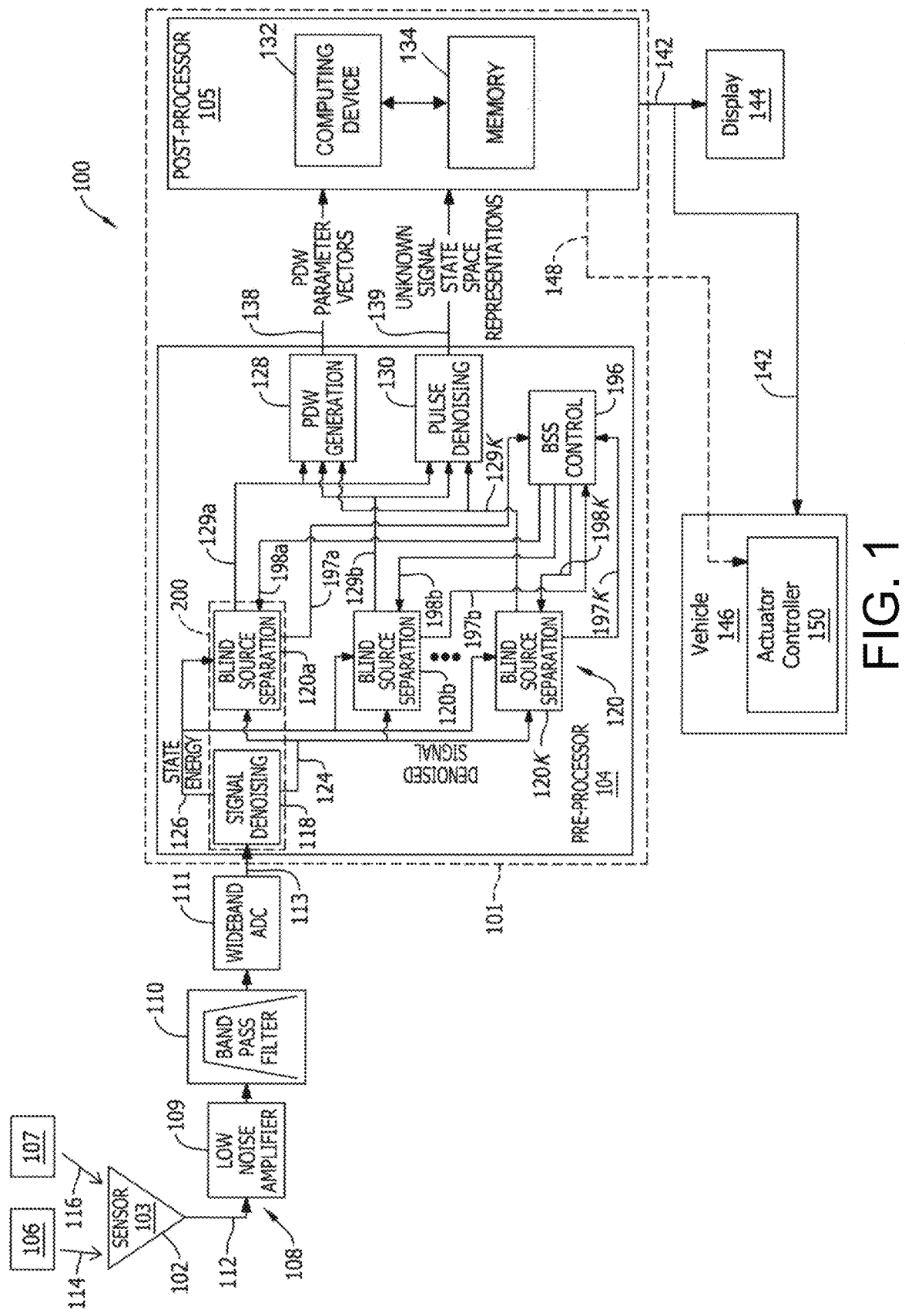
FIG. 1 is a block diagram showing a denoising and BSS architecture incorporated in a signal processing system for generating pulse descriptor words (PDWs) using blind source separation.

Various embodiments of systems and methods for estimating frequency and bandwidth of unknown signals using a learned filter pair response will now be described in detail for the purpose of illustration. At least some of the details disclosed below relate to optional features or aspects, which in some applications may be omitted without departing from the scope of the claims appended hereto. In addition, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Electronic warfare systems are receive-only real-time systems that have front-end receivers that produce pulse descriptor words (PDW) for each radar pulse they detect. Electronic warfare receivers are unlike radar systems in that they do not naturally produce range and they must handle unknown signals rather than look for reflected versions of their transmitted signals. In the commercial world, 5G analysis systems also cover a very large bandwidth and wideband receivers that characterize 5G signals and interfering signals must also handle many unknown signals. The digital versions of these receivers are typically designed as a filter bank. Within each filter channel, radar pulses are separated from other coincident signals and have their noise decreased by the relative filter bandwidth compared to the total input bandwidth. These pulses with their increased signal-to-noise ratio (SNR) are processed to estimate PDW elements such as pulse width, frequency, time of arrival, bandwidth, and amplitude for signal classification. While such channelizers have many advantages, they also have key disadvantages such as large size, weight and power due to the multipliers and adders required for very large filter banks that operate continuously whether a signal is present or not. In addition, signals that do not match the bandwidth and frequency of each filter in the filter bank are processed sub-optimally or split across filter channels, resulting in missed, false and inaccurate PDWs. Finally, signals of unknown type that do not match the model of simple pulsed signals largely fail to be processed correctly. If a channelizer is not used, the two main processing tasks of noise reduction and signal separation must be done using different methods. Noise reduction can be done using denoising techniques which model signals via adaptive recursive equations that enhance the structure of signals and consequently reduce the unstructured signal noise. Signal separation requires constructing on-the-fly real-time automated matched filter construction.

As previously discussed, the channelizers typically used in Electronic Warfare receivers have some disadvantages such as large size, weight and power due to the multipliers and adders required for very large filter banks that operate continuously whether a signal is present or not. In addition, signals that do not match the bandwidth and frequency of each filter in the filter bank are processed sub-optimally or split across filter channels, resulting in missed, false and inaccurate PDWs. Finally, signals of unknown type that do not match the model of simple pulsed signals largely fail to be processed correctly.

If a channelizer is not used, the two main processing tasks of noise reduction and signal separation of unknown signals must be done using different methods. Both noise reduction and signal separation can be done together if accurate and low-latency estimates of signal frequency and bandwidth are available, which is achievable using the method proposed herein. This is because such low-latency estimates enable a filter with the matching frequency and bandwidth to be instantly generated and the signal filtered from that point on. Thus, the signal has been noise reduced and separated before it has gone away, enabling low-latency real-time operation. This enables both noise reduction and signal separation.

The innovative methods proposed herein improve on a previous approach using denoising and blind source separation (BSS), which approach is described in detail in U.S. Pat. No. 10,429,491 and will be more briefly described herein with reference to FIGS. 1 and 2. Blind source separation is the process of taking one or more signal collection inputs and attempting to separate each signal within the summed collection of signals without a priori knowledge of the signals. This separation is based primarily on frequency content, i.e., energy in a contiguous range of frequencies. BSS subsystems and methods are employed for separation (i.e., filtering) of one or more source signals of interest from a plurality of mixed signals.

FIG. 1 is a block diagram identifying components of a signal processing system 100 for generating PDWs using BSS. The signal processing system 100 includes a signal data processor 101 communicatively coupled to an antenna 102 by way of a pre-conditioner 108. Antenna 102 may be embodied as a wide-area sensor 103. Signal data processor 101 includes a pre-processor 104 and a post-processor 105. Sensor 103 is configured to surveil at least one radar signal emitter (two radar signal emitters 106 and 107 are indicated). Pre-conditioner 108 includes at least one electronic component (e.g., a low-noise amplifier 109, a band pass filter 110, and a wideband analog-to-digital converter (ADC) 111) configured to pre-condition a sensor output signal 112. In operation, pre-conditioner 108 is configured to convert a sensor output signal 112 received from sensor 103 into a conditioned signal 113 transmitted to pre-processor 104.

Each conditioned signal 113 is derived from a time-varying signal received at sensor 103. Time-varying signals may include a mix of signals received from radar signal emitters 106 and 107. For example, time-varying signals may include a first radar signal 114 generated by radar signal emitter 106 or a second radar signal 116 generated by radar signal emitter 107, which signals are received by sensor 103.

The pre-processor 104 includes one or more signal denoising modules 118, and a plurality of BSS modules 120. Each BSS module 120 is coupled to a single signal denoising module 118, and represents one BSS channel 200. A total number of BSS channels 200 in signal processing system 100 is expressed as K. Signal denoising module 118 transmits a denoised signal 124 and a state energy signal 126 to each respective BSS module 120 (e.g., 120a, 120b, ..., 120K) of the plurality of BSS modules 120. State energy signal 126 represents a quantity (e.g., an analog voltage level) that is proportional to the sum of the absolute value of an amplitude of incoming signal 113 squared at particular sampled time points (i.e., states).

In operation, incoming signal 113 is transmitted from pre-conditioner 108 to signal denoising module 118, where incoming signal 113 undergoes signal denoising and is subsequently transmitted as denoised signal 124 to each BSS module 120. For example, first radar signal 114 is initially received at sensor 103 as a pulse having signal characteristics including, without limitation, a frequency and a bandwidth. In this example, a single pulse of first radar signal 114, after processing by pre-conditioner 108, is then received at signal denoising module 118 as a mixed signal (i.e., the incoming signal 113 represents a signal pulse of the first radar signal 114 and has various characteristics including, without limitation, noise and information other than the desired information of interest). Signal denoising module 118 denoises the mixed incoming signal 113 prior to transmitting denoised signal 124 having a frequency and a bandwidth (or a regular pattern of frequencies and bandwidths) to the BSS modules 120. Methods implemented by signal processing system 100 are performed in substantially real time by the devices and systems described above, and as shown and described below in further detail with reference to FIG. 2.

Pre-processor 104 further includes a BSS control module 196 coupled to each BSS module 120. BSS control module 196 is configured to transmit a respective BSS control signal 198a through 198K to each of BSS modules 120, as further shown and described below with reference to FIG. 2. The plurality of BSS modules 120 connected to the BSS control module 196 will be referred to herein as the "BSS subsystem".

Further, pre-processor 104 comprises a PDW generation module 128 and a pulse denoising module 130, both of which are coupled to receive blind source separated signals 129 from a plurality of BSS modules 120 of a BSS subsystem. PDW generation module 128 generates PDW parameter vector signals 138 based on respective blind source separated signals 129 (e.g., 129a, 129b, ..., 129K) received from the BSS modules 120 (e.g., 120a, 120b, ..., 120K). Each PDW parameter vector signal 138 contains data representative of characteristics of interest of one of radar signals 114 and 116 derived from a singular pulse of blind source separated signal 129 (e.g., frequency, bandwidth, time of arrival, time of departure, pulse width, pulse amplitude, pulse repetition interval, and/or angle of arrival (AOA)). Pulse denoising module 130 also generates an unknown signal state space representation signal 139 based on blind source separated signals 129. Unknown signal state space representation signal 139 contains data representative of additional (e.g., non-PDW-type) characteristics of interest of one of radar signals 114 and 116 from which usable spatial information about one of radar signal emitters 106 and 107 is discernable. PDW parameter vector signals 138 and unknown signal state space representation signals 139 are transmitted to post-processor 105.

Further, post-processor 105 comprises a computing device 132 and a memory 134. The memory 134 comprises one or more non-transitory tangible computer-readable storage media. Post-processor 105 is communicatively coupled to pre-processor 104. In accordance with one embodiment, the computing device 132 is a processor running software.

The PDW generation module 128 is configured to receive a respective blind source separated signal 129 from each BSS module 120. PDW generation module 128 is further configured to transmit a PDW parameter vector signal 138 to post-processor 105. PDW parameter vector signal 138 received by computing device 132 is stored as computer-readable data in memory 134 including, without limitation, as at least one buffered data set.

The PDW generation module 128 sends each PDW to the computing system 132 as a PDW parameter vector signal 138 similar to (amplitude, time of arrival, center frequency, pulse width and bandwidth)=(amp, toa, f, pw, w). The PDW for each intercepted signal is stored in a pulse buffer for further processing by the computing system 132. As part of such processing, the PDWs are sorted and deinterleaved by clustering the incoming radar pulses into groups. In principle, each group should have characteristics representative of a single radar source or class of radar sources which allows that radar source or class to be identified. The identity of a particular signal is usually inferred by correlating the observed characteristics of that signal with characteristics stored in a list that also contains the identity of known radars.

The pulse denoising module 130 is configured to receive blind source separated signals 129 from each BSS module 120. Pulse denoising module 130 is further configured to transmit an unknown signal state space representation signal 139 to post-processor 105. Unknown signal state space representation signal 139 received by computing device 132 is stored as computer-readable data in memory 134, including, without limitation, as at least one buffered data set. In an exemplary implementation, computing device 132 fetches buffered data sets from memory 134 for processing using a computer-based method that employs an operating system running software executed from instruction set data also stored in memory 134.

The computing device 132 is configured to perform operations based on data contained in the PDW parameter vector signals 138 and unknown signal state space representation signals 139. Such operations include, without limitation, detecting, processing, quantifying, storing, and controlling a display device 144 for displaying (e.g., in human-readable data form) various characteristics of at least one of the radar signals 114 and 116 represented as data in the PDW parameter vector signals 138 and unknown signal state space representation signals 139. For example, a PDW parameter vector signal 138 generated by PDW generation module 128 may contain a plurality of PDW vector data blocks structured in a vector format, where each PDW vector data block contains one parameter of the first radar signal 114. Parameters representative of at least one characteristic of the first radar signal 114 contained in one PDW vector data block may include, without limitation, frequency, bandwidth, time of arrival, time of departure, pulse width, pulse amplitude, pulse repetition interval, and/or AOA.

Resultant data from operations performed by the computing device 132 are stored in memory 134. Further, in the exemplary implementation, computing device 132 causes post-processor 105 to transmit a human-readable data signal 142 to a human machine interface to facilitate at least one of an interaction, a modification, a visualization, at least one further operation, and a viewable recording of information about at least one radar signal 114 and 116 by a user of signal processing system 100. The human machine interface may be, for example, a display device 144 which receives the human-readable data signal 142 from post-processor 105. In one example, characteristics of radar signal emitters 106 and 107 determined by signal processing system 100 are displayed on display device 144 as a map having a grid representative of a physical spatial domain including a surveillable space of sensor 103, where locations and identifying information of radar signal emitters 106 and 107 are displayed and plotted substantially in real time. The human-readable data signal 142 may also be transmitted from post-processor 105 to at least one device and/or system (e.g., an aerial or ground-based vehicle 146) associated with signal processing system 100. Further, the computing device 132 enables post-processor 105 to transmit, in substantially real time, an actuator control signal 148 to an actuator controller 150 included within vehicle 146 to facilitate controlled movements thereof. For example, vehicle 146 may be a remotely and/or autonomously operated land vehicle or an unmanned aerial vehicle.

In operation, conditioned signal 113 is received by signal denoising module 118, where it undergoes signal denoising. The denoised signal 124 is transmitted to each BSS module 120. For example, first radar signal 114 may be transmitted to sensor 103 by first radar signal emitter 106 as a pulse having signal characteristics including, without limitation, a frequency (e.g., a center frequency) and a bandwidth. In this example, a single pulse of first radar signal 114 is received at signal denoising module 118 as a mixed signal (i.e., a signal pulse having various characteristics including, without limitation, noise and information other than the desired information of interest). Signal denoising module 118 denoises the mixed signal prior to transmitting a denoised signal 124 having a frequency and a bandwidth (or a regular pattern of frequencies and bandwidths). Methods implemented by signal processing system 100 are performed in substantially real time by the devices and systems described above, and as shown and described below in further detail with reference to FIG. 2.

In one mode of operation, at least one of frequency and bandwidth information contained in respective PDWs is plotted on a map on the display device 144 along with locations of respective radar signal emitters 106 and 107 to facilitate accurate tracking of locations and association with those particular radar signal emitters. In cases where at least one radar signal emitter is mobile, the map on display device 144 updates location information of at least one respective mobile radar signal emitter in substantially real time. Furthermore, the computing device 132 determines at least one of a velocity, an acceleration, a trajectory, and a track (i.e., including present and prior locations) of one or more mobile radar signal emitters (e.g., radar signal emitters 106 and 107). In another mode of operation, characteristics determined by signal data processing methods implemented by the signal data processor 101 may trigger a variety of substantially real-time physical actions in physical devices and systems in communication with the signal processing system 100. For example, characteristics of various radar signal emitters, including frequency and bandwidth determined by signal data processing methods implemented by signal processing system 100, may be transmitted in substantially real time as data to actuator controller 150 in vehicle 146 (e.g., rudders and flaps of a unmanned aerial vehicle) to facilitate maneuvers thereof, for example, to avoid an area of operation of an unauthorized radar signal emitter determined to be a threat or to move toward the unauthorized emitter to eliminate the threat. As a further example, characteristics of radar signal emitters 106 and 107 determined by signal data processing methods described herein may be transmitted in substantially real time in a control signal to at least one of an electronic support measure (ESM) device and an EW system associated with signal processing system 100 to direct, for example, a radar jamming signal at a particular radar signal emitter operating in the surveillable environment of sensor 103 without authorization.

Each BSS module 120 in signal processing system 100 implements filtering methods with dynamic updating to generate high-quality PDWs containing at least one of amplitude, frequency, center frequency, bandwidth, pulse time of arrival, and pulse width information. In operation, each BSS module 120 separates a respective denoised signal 124. Each BSS module 120 contains a plurality of tunable filters, wherein each filter operates in accordance with filter parameters that include, without limitation, a center frequency and a bandwidth. Further, in the exemplary embodiment, pre-processor 104 includes a BSS control module 196, which facilitates controlling BSS modules 120. BSS control module 196 receives respective BSS data signals 197 (e.g., 197a, 197b, . . . , 197K) containing BSS-related information including, without limitation, frequency, bandwidth, and state, from each BSS module 120. Based on the BSS-related information contained in BSS data signals 197, BSS control module 196 also generates and transmits respective BSS control signals 198 (e.g., 198a, 198b, . . . , 198K) back to each respective BSS module 120 to control, for example and without limitation, a timing of receipt of denoised signal 124 and transmission of respective blind source separated signals 129 to at least one of PDW generation module 128 and pulse denoising module 130. The BSS control module 196 is further configured to tune (i.e., update) the center frequency and bandwidth of each filter of the plurality of filters in each BSS module 120 to enable radar signals which fall within the input bandwidth to be separated out in consistent BSS channels.

Figure 2:
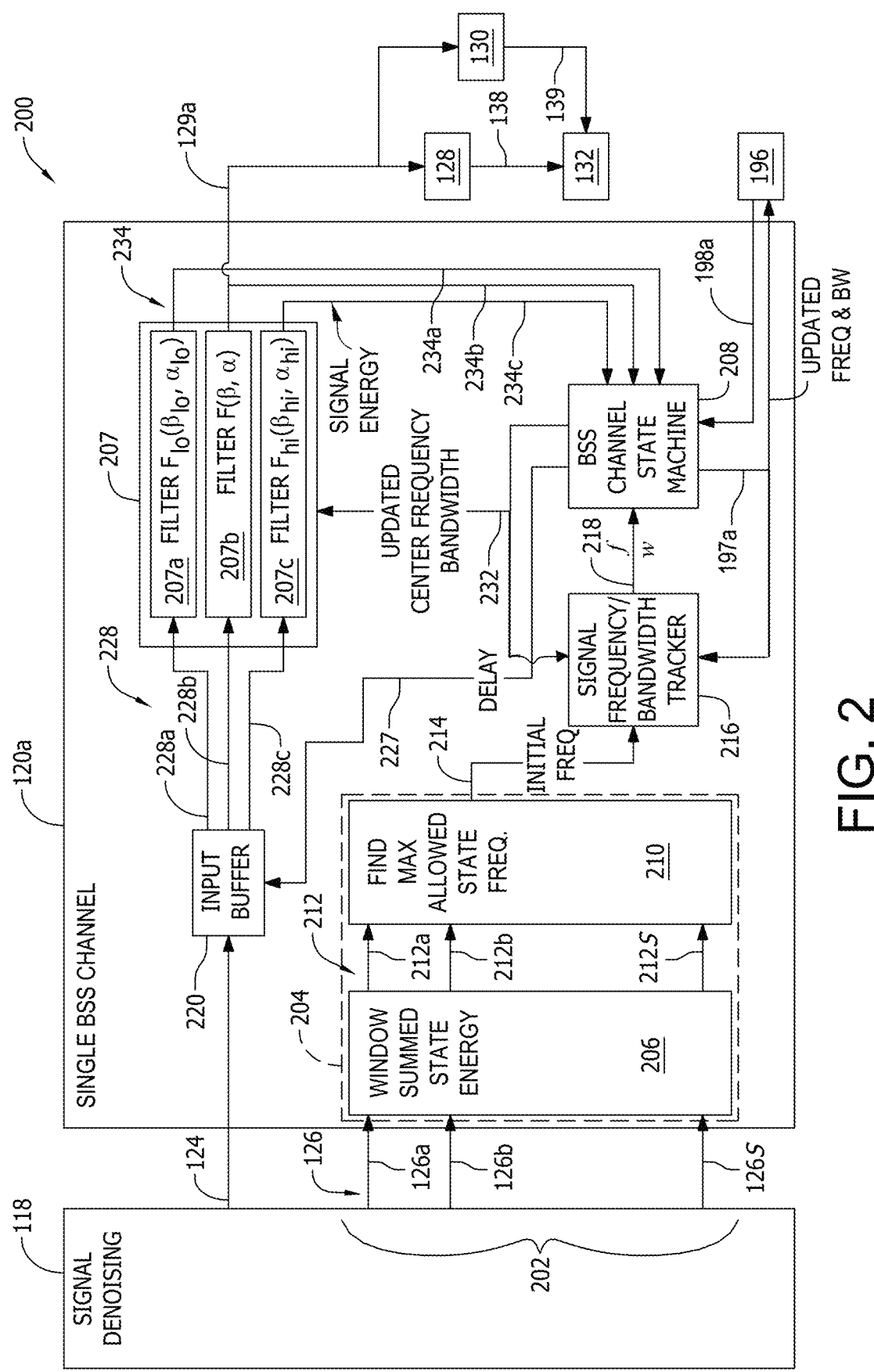
FIG. 2 is a block diagram identifying components of a blind source separation channel (hereinafter "BSS channel") that may be used in the signal processing system depicted in FIG. 1 to track both frequency and bandwidth.

FIG. 2 is a block diagram identifying components of an exemplary BSS channel 200 that may be used in the signal processing system 100 depicted in FIG. 1. The signal denoising module 118 transmits a denoised signal 124 and a plurality of state energy signals 126. Also, the plurality of state energy signals 126 are representative of a state output 202 of the signal denoising module 118. Each state energy signal 126 of the plurality of state energy signals 126 contains information that is representative of the state (e.g., the analog voltage level that is proportional to the amplitude of incoming signal 113 at particular sampled time points) of a respective state output 202 of signal denoising module 118. The plurality of state energy signals 126 are received by a state energy analysis subsystem 204. State energy analysis subsystem 204 determines a center frequency f of respective state energy signals 126 of S signals (e.g., 126a, 126b, . . . , 126S) corresponding to S filter states of a filtering subsystem 207. State energy analysis subsystem 204 includes a window summer module 206 configured to determine a total energy within a set of S windows of length $N_e$ (i.e., one for each state of a BSS channel state machine module 208 of BSS module 120*a*). BSS channel state machine module 208 coordinates a timing of filtering of denoised signal 124 by filtering subsystem 207. State energy analysis subsystem 204 also includes a maximum energy detection module 210 coupled to window summer module 206. Maximum energy detection module 210 is configured to receive S summed window signals 212 (e.g., 212*a*, 212*b*, . . . , 212S) and determine a maximum allowed state frequency of each summed window signal 212 of the S summed window signals 212. Maximum energy detection module 210 is further configured to determine and transmit a first or initial frequency signal 214 to a signal frequency and bandwidth tracker module 216 coupled to maximum energy detection module 210.

Initial frequency signal 214 is representative of the $f_0$ of the maximum energy of the respective state energy signal 126 corresponding to the associated state of BSS channel 200. Signal frequency and bandwidth tracker module 216 uses initial frequency signal 214 to determine a center frequency (f) and a bandwidth (w) of the respective summed window signal 212 corresponding to the maximum energy state of BSS channel 200. Signal frequency and bandwidth tracker module 216 further outputs an f and w signal 218 to BSS channel state machine module 208. BSS channel state machine module 208 is communicatively coupled to filtering subsystem 207, signal frequency and bandwidth tracker module 216, an input buffer module 220, and computing device 132. Substantially simultaneously with receipt of f and w signal 218 by BSS channel state machine module 208, input buffer module 220 delays filtering of denoised signal 124 by filtering subsystem 207 to enable BSS channel state machine 208 to update f and w filter parameters of filtering subsystem 207.

Still referring to FIG. 2, filtering subsystem 207 is a tunable filter bank including a plurality of filter modules. In the illustrated embodiment, the filtering subsystem 207 includes a low filter ($F_{lo}$) module 207*a*, a main filter (F) module 207*b*, and a high filter ($F_{hi}$) module 207*c*. Input buffer module 220 is coupled to and between filtering subsystem 207 and signal denoising module 118, and is configured to transmit a plurality of filter input signals 228 (e.g., 228*a-c*) to respective filter modules (e.g., 207*a-c*) in filtering subsystem 207. Input buffer module 220 is further configured to receive a delay signal 227 transmitted from a first output of the BSS channel state machine module 208. Delay signal 227 controls when the filter input signal 228 is sent from the input buffer 220 to the filtering subsystem 207. From a second output, BSS channel state machine module 208 transmits a center frequency and bandwidth update signal 232 to filtering subsystem 207. Center frequency and bandwidth update signal 232 enables continuous updating off and w operational parameters and associated filter coefficients α and β, respectively, of each filter module (e.g., 207*a*, 207*b*, and 207*c*) in filtering subsystem 207.

In operation, each of the filter modules 207*a-c* in filtering subsystem 207 is embodied as at least one of a finite impulse response (FIR) filter and an infinite impulse response (IIR) filter. In an exemplary implementation, use of IIR-type filters in filtering subsystem 207 enables lower-cost filter devices having greater precision than FIR-type filters. Also, in an exemplary implementation, each BSS channel 200 processes radar signals rather than communications signals and, therefore, the effects of a non-constant group delay caused by using IIR filters is less important than with communications signals and IIR filters adequately meet the signal quality required for post-filtering PDW deinterleaving by post-processor 105.

The BSS channel shown in FIG. 2 may be part of a BSS subsystem (e.g., the system depicted in FIG. 1) that has a number of BSS channels, each containing tunable filters, where each BSS channel produces a (presumed) unique separated and noise reduced signal at its output. Each of these channels must do the following: (1) It must track both the signal's frequency and bandwidth so that it produces a continuous and undistorted output for each continuous input signal. (2) It must detect when a signal goes away and stop producing output. (3) It must then find another non-separated signal to separate. (4) It must not duplicate a separated signal occurring on another channel. (5) It must be capable of finding and separating all signals with detectable SNR that are present if enough filter resources are available.

A single BSS channel is shown in FIG. 2 with a denoiser subsystem and state energy measurement that feed noise reduced signals which are detected by the states of the denoiser and used to start the BSS channel with an approximate center frequency. The frequency and bandwidth estimation shown in FIG. 2 uses three filters (F, $F_{lo}$, $F_{hi}$). In operation, main filter module 207*b* (F) is used as the "correct" tracking filter for the filter input signal 228 being separated. Low filter module 207*a* ($F_{lo}$) and high filter module 207*c* ($F_{hi}$) are used in the tracking process to keep main filter module 207*b* on target in both frequency and bandwidth. Also, low filter module 207*a* and high filter module 207*c* are offset by fixed amounts in frequency and bandwidth and, as with main filter module 207*b*, are continuously monitored to facilitate appropriate and timely tuning of the center frequency and bandwidth of each filter module.

In operation, each of the filter modules 207*a-c* is parameterized by two values (i.e., center frequency f and bandwidth w) which are stored in memory 134. The center frequency and bandwidth values are updated by the BSS control module 196. Specifically, one instantiation could be:

$$\text{center frequency}(F) = f \quad (1)$$

$$\text{bandwidth}(F) = w \quad (2)$$

$$\text{center frequency}(F_{lo}) = f - \Delta f \quad (3)$$

$$\text{bandwidth}(F_{lo}) = w - \Delta w \quad (4)$$

$$\text{center frequency}(F_{hi}) = f + 2\Delta f \quad (5)$$

$$\text{bandwidth}(F_{hi}) = w + 2\Delta w \quad (6)$$

This allows adjustment of filter F both up and down in frequency and up and down in bandwidth. To do this update, the filter measurement of energy at time n is defined to be (E(n), $E_{lo}$(n), $E_{hi}$(n)), where n=1, 2, etc. Then the update algorithm (which is configured to update the f and w parameters) becomes:

$$f \leftarrow f + \alpha_0 *[(E(n)-E_{lo}(n))/(E(n)+E_{lo}(n))] + \alpha_1 *[(E(n)-E_{hi}(n))/(E(n)+E_{hi}(n))] + \alpha_2 \quad (7)$$

$$w \leftarrow w + \beta_0 *[E(n)-E_{lo}(n)]/[E(n)+E_{lo}(n)] + \beta_1 *[(E(n)-E_{hi}(n))/(E(n)+E_{hi}(n))] + \beta_2 \quad (8)$$

Here the coefficient vectors α and β are functions of window size, bandwidth, and SNR and are computed by pretraining.

Figure 3:
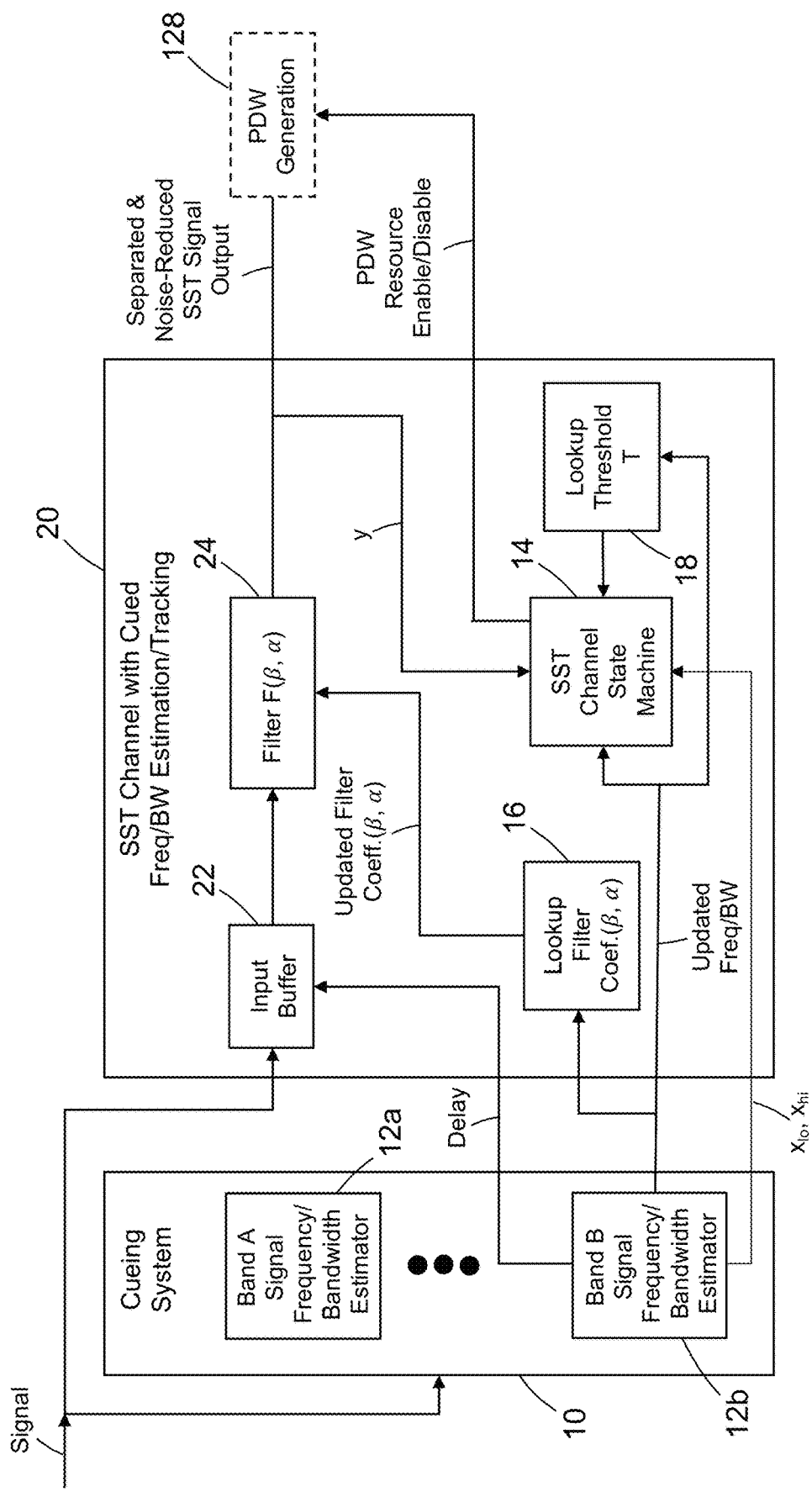
FIG. 3 is a block diagram identifying components of a signal separation and tracking channel (hereinafter "SST channel") that may be used in a signal processing system to track both frequency and bandwidth. For example, a cueing system and an SST channel of the type partly depicted in FIG. 3 may be substituted for each signal denoising module 8 and associated BSS channel partly depicted in FIG. 1.

By contrast, this disclosure proposes a new signal cueing and tracking approach involving cued frequency/bandwidth estimation/tracking. FIG. 3 is a block diagram identifying components a proposed signal processing system capable of tracking both frequency and bandwidth. The components depicted in FIG. 3 include a cueing system 10 and an SST channel 20 which may be respectively substituted for each signal denoising module 8 and associated BSS channel in the system depicted in FIG. 1.

The cueing system 10 includes a respective signal frequency/bandwidth estimator for each band of interest. In the example depicted in FIG. 3, one signal frequency/bandwidth estimator 12a for Band A and another signal frequency/bandwidth estimator 12b for Band B are shown. Each cueing signal frequency/bandwidth estimator includes a pair of overlapping fixed filters and signal processing circuitry that performs the process depicted in FIG. 5. The cueing system 10 detects the presence of signals at certain frequencies and bandwidths, without doing noise reduction as the channelizer would have done in a traditional approach. Instead, noise reduction is done using the signal separation and tracking filters (e.g., tunable filter 24 in FIG. 3).

Each cueing signal frequency/bandwidth estimator outputs data to a corresponding SST channel 20. Only one such channel, corresponding to signal frequency/bandwidth estimator 12b, is shown in FIG. 3. The SST channel 20 shown in FIG. 3 has the following components: (1) a plurality of filter coefficient lookup tables 16 in which values for respective filter coefficients ($\beta$, $\alpha$) are stored; (2) a threshold lookup table 18 storing threshold values T; (3) an SST channel state machine 14; (4) a tunable filter 24; and (5) an input buffer 22. The term "$\beta$" in the phrase "filter coefficients ($\beta$, $\alpha$)" refers to a number of feedforward filter coefficients equal to or greater than two; the term "$\alpha$" in the phrase "filter coefficients ($\beta$, $\alpha$)" refers to a number of feedback filter coefficients equal to or greater than unity. For example, the tunable filter 24 may be a second-order IIR filter having three feedforward filter coefficients $\beta_0$, $\beta_1$, and $\beta_2$ and two feedback filter coefficients $\alpha_1$ and $\alpha_2$, for a total of five filter coefficients. In that case, a respective filter coefficient lookup table 16 is provided for each of the five filter coefficients needed to tune the tunable filter 24. In response to frequency and bandwidth estimates received from the signal frequency/bandwidth estimator 12b, those five lookup tables would output the five filter coefficients to tunable filter 24. The frequency and bandwidth estimates output by signal frequency/bandwidth estimator 12b are also input to the SST channel state machine 14 and the threshold lookup table 18. As seen in FIG. 3, the outputs $x_{lo}$ and $x_{hi}$ from high and low filters of the signal frequency/bandwidth estimator 12b are also input to the SST channel state machine 14. (As used herein, the terms "low filter" and "high filter" are used in conjunction to refer to a pair of filters having relatively lower and relatively higher center frequencies.) Lastly, input buffer module 22 receives a delay signal from signal frequency/bandwidth estimator module 12b. This delay signal controls when the filter input signal is sent from the input buffer 22 to the tunable filter 24.

The frequency and bandwidth estimation method used in the SST channel 20 depicted in FIG. 3 is different from that described with reference to FIG. 2 in several ways: (1) Instead of using energy measurements from a filter triple to steer the center filter, the method proposed herein is a direct way to use the filter response of a pair of IIR filters to estimate these two quantities in noise and with very low latency. (2) The old method required tracking updates to produce accurate frequency and bandwidth, whereas the method proposed herein directly measures f and w within a fixed band and thus does not operate in a blind fashion. (3) The method proposed herein allows a cueing system to update tracking filters in an SST channel, rather than updating a filter triple, allowing two fixed filters to direct a single (tunable) tracking filter, rather than involving three tunable filters. This saves resources both because the cueing system is typically much smaller than a corresponding denoiser and the signal tracking channels are also simpler.

Cueing Signal Frequency/Bandwidth Estimator

Figure 4:
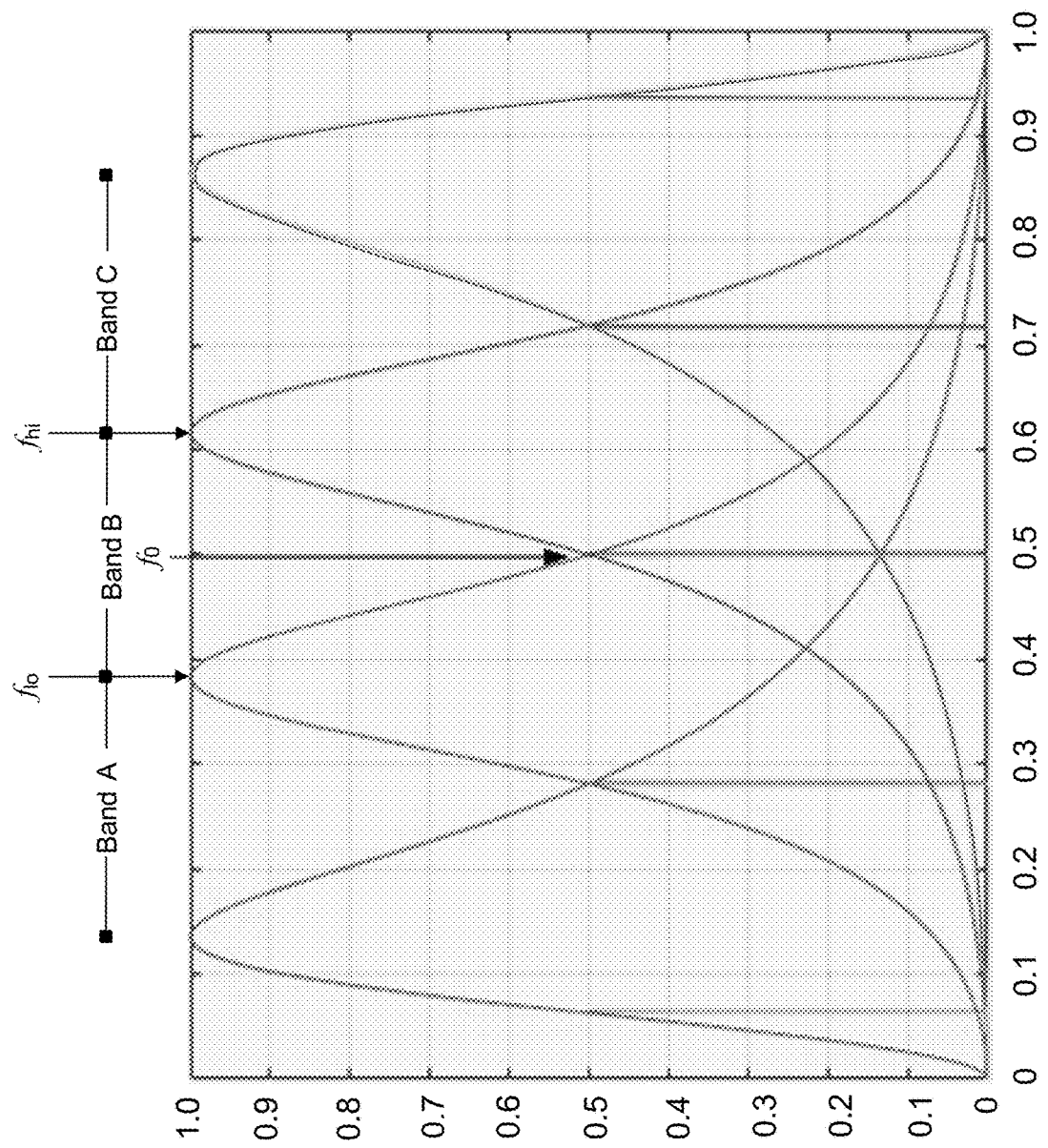
FIG. 4 is a graph showing the filter responses as a function of frequency for four consecutive fixed filters with overlapping filter responses that can monitor three bands of interest (as shown) by using each consecutive filter pair.

The frequency and bandwidth estimation method proposed herein requires a pair of partially overlapping fixed filters for each frequency band of interest. FIG. 4 shows the filter responses as a function of frequency for four consecutive fixed filters (hereinafter "cueing filters") with overlapping filter responses that can monitor three bands of interest (Bands A, B, and C in FIG. 4) as shown, by using each consecutive filter pair. For example, a signal frequency/bandwidth estimator based on a consecutive filter pair which covers the frequency range [$f_{lo}$, $f_{hi}$], where the center frequency is $f_0$ (with amplitude response ½ in the case shown in FIG. 4), will be used in the discussion that follows. Each filter pair includes first and second fixed filters having partially overlapping bandwidths that include a frequency range bounded by lower- and upper-bound frequencies $f_{lo}$ and $f_{hi}$ and having center frequency $f_0$. The first fixed filter of the pair has a center frequency equal to the lower-bound frequency $f_{lo}$ and the second fixed filter of the pair has a center frequency equal to the upper-bound frequency $f_{hi}$.

Figure 5:
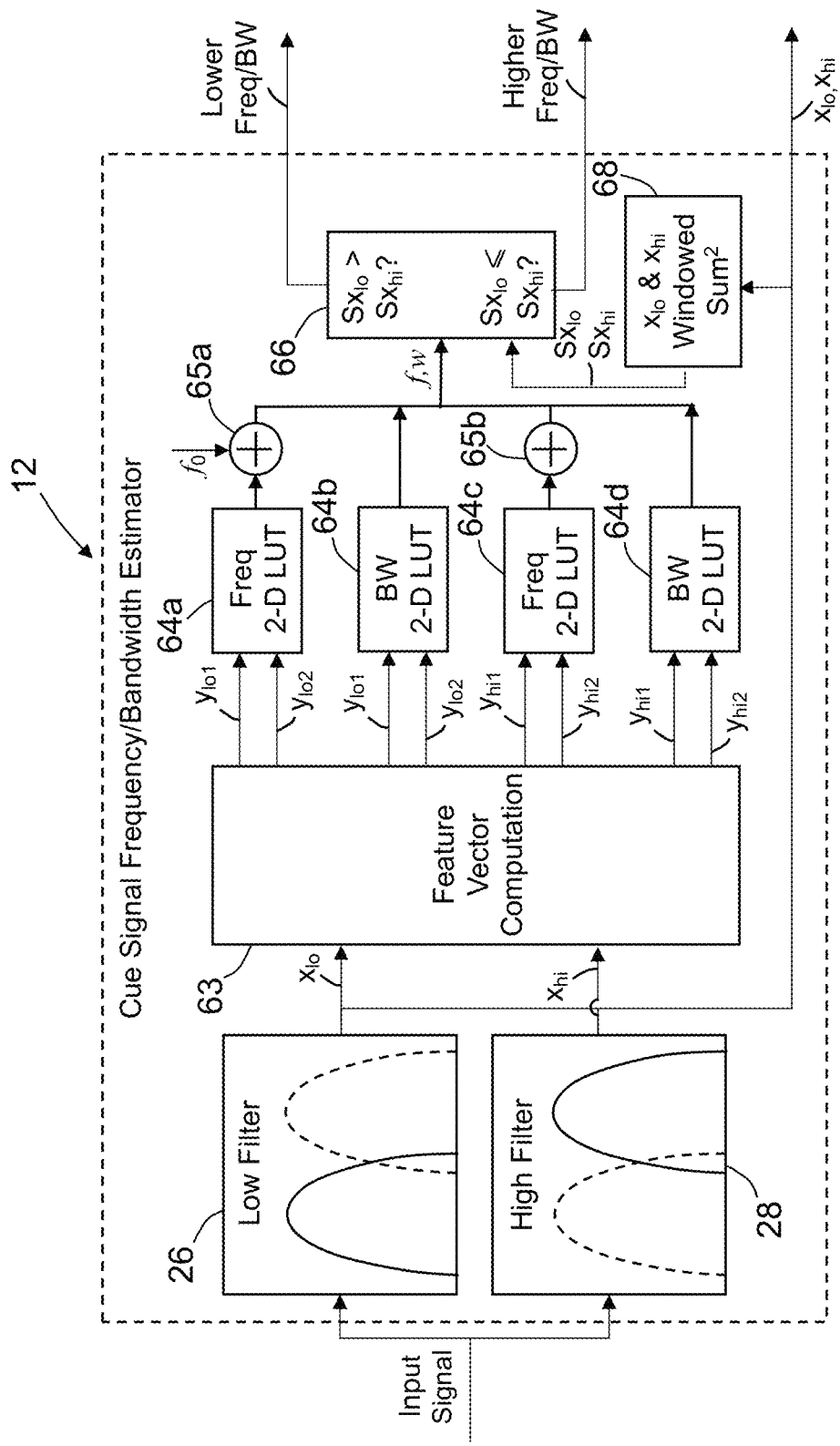
FIG. 5 is a diagram representing both functions of a process and functional modules of electronic circuitry which is configured to perform frequency and bandwidth estimation of signals output by a pair of overlapping fixed filters.

FIG. 5 is a diagram representing both functions of a process and functional modules of electronic circuitry which is configured to perform frequency and bandwidth estimation of signals output by a pair of overlapping fixed filters. The overlapping fixed filters include a low filter 26 and a high filter 28. The functions of the process identified in FIG. 5 are performed by electronic circuitry configured as data processing modules and lookup tables. The digital data is processed in a streamlined manner as indicated by arrows in FIG. 5. From left to right, the steps of the process in accordance with one proposed implementation are as follows:

1. The low filter 26 and high filter 28 produce respective outputs at every incoming sample, where $x_{lo}$ is the output of the low filter 26 and $x_{hi}$ is the output of the high filter 28.

2. The filter outputs $x_{lo}$ and $x_{hi}$ are fed into a feature vector computation module 63 which produces four feature vectors: $y_{lo1}$ and $y_{lo2}$ are the two low-filter feature vectors (to be used when the signal is estimated to have a center frequency less than $f_0$). Similarly, $y_{hi1}$ and $y_{hi2}$ are the two high-filter feature vectors (to be used when the signal is estimated to have a center frequency more than $f_0$).

3. Then pairs of the feature vectors go into four 2-D interpolating lookup tables 64a-64d which have been trained through a machine learning process to provide best estimators of frequency offset and bandwidth. More specifically, feature vectors $y_{lo1}$ and $y_{lo2}$ are input to frequency offset lookup table 64a and bandwidth lookup tables 64b; while feature vectors $y_{hi1}$ and $y_{hi2}$ are input to frequency offset lookup table 64c and bandwidth lookup table 64d. As a result, frequency offset and bandwidth estimates for the frequency range [$f_{lo}$, $f_0$] are read out from frequency offset and bandwidth lookup tables 64a and 64b respectively; while frequency offset and bandwidth estimates for the frequency range [$f_0$, $f_{hi}$] are read out from frequency offset and bandwidth interpolating lookup tables 64c and 64d respectively. Each lookup table (LUT) produces an interpolated frequency offset and then a respective post-LUT adder 65a-65d adds the center frequency $f_0$ for each LUT to produce the final frequency estimate f.

4. The four output values corresponding to the lower and higher frequency and bandwidth estimates go into a decision process 66 that selects and reports a final frequency and bandwidth estimate depending on whether a windowed sum squared of the output of the low filter 26 (designated $Sx_{lo}$ in FIG. 5) is less or more than the windowed sum squared of the output of the high filter 28 (designated $Sx_{hi}$ in FIG. 5) (step 68).

The feature vector computation module 63 is configured to compute the aforementioned feature vectors. More specifically, electronic circuitry is configured to compute feature vectors in accordance with the process 30 depicted in FIG. 6. The operations of process 30 are first explained mathematically and then described in more detail.

If $x_{lo}$ is the output of the low filter $F_{lo}$ and $x_{hi}$ is the output of the high filter $F_{hi}$, one may compute a pair of features (or parameters) $(y_{lo1}, y_{lo2})$ associated with the frequency range $[f_{lo}, f_0]$ and a pair of features (or parameters) $(x_{hi1}, x_{hi2})$ associated with the frequency range $[f_0, f_{hi}]$ and then choose the best pair for estimation. The purpose of this split at the center frequency $f_0$ is to help with creating a grid of points so that learning the frequency offset $\Delta f$ and bandwidth w estimates from these parameters is robust with respect to noise. Note that when the frequency offset $\Delta f$ from the center frequency $f_0$ is estimated, one can then estimate the true frequency using $f_0 + \Delta f$.

The process of learning $\Delta f$ and w from the feature vectors can be done in different ways. One common method uses neural networks which have layers of linear combiners followed by non-linear elements. The learning takes place by generating a training set of data to find the linear combiner coefficients so that when two feature vectors are input, the resulting output of estimated $\Delta f$ and w is accurate. Essentially, this learning is a means to interpolate an unknown nonlinear function in two dimensions by generating many example values that cover the range of the input and output. However, since one needs to both create a very low latency interpolation method and use resources effectively in an implementation such as an FPGA, an alternative learning method is used whereby a training set of data is generated and then a 2-D grid is imposed on the data with output values assigned to each grid element. This grid is then stored in a lookup table and the output of the lookup table is then interpolated using a linear interpolation in two dimensions. This creates a low latency method to give frequency and bandwidth estimates directly from filter pair outputs. The 2-D interpolating lookup table is described in more detail below.

Figure 7A:
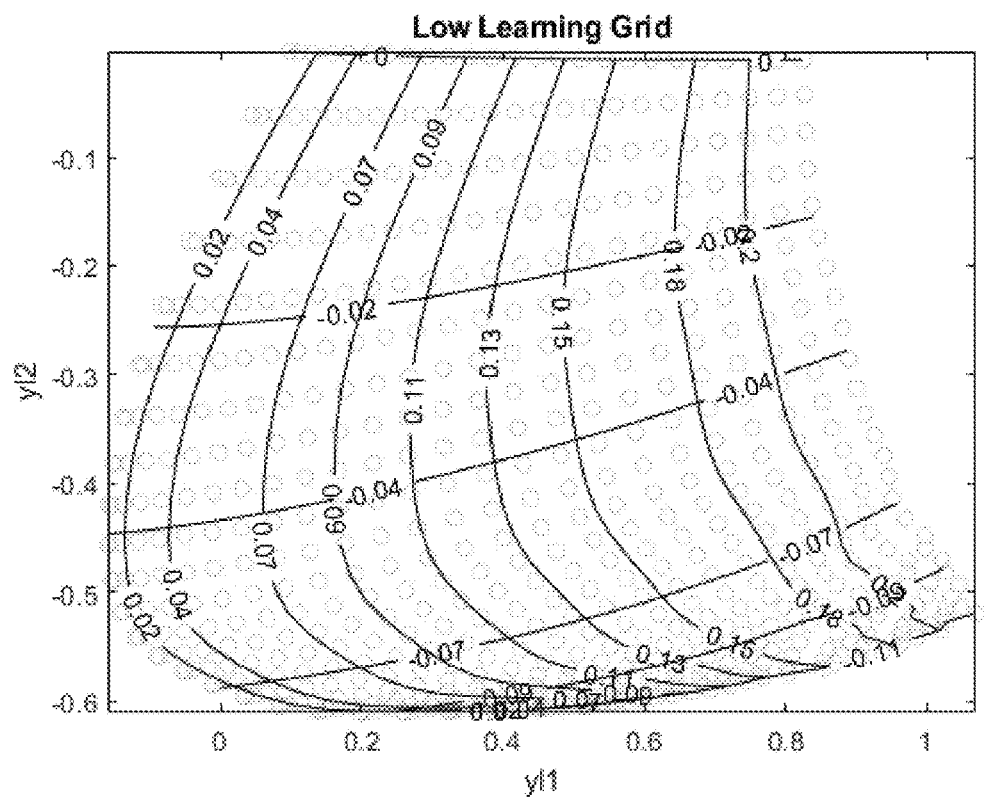
FIGS. 7A and 7B are graphs respectively showing low and high learning grids consisting of a grid of points which respectively indicate a particular generated signal of a known frequency and bandwidth in accordance with one proposed implementation. Overlaid on these grids are contours showing both frequency offset and bandwidths.
Figure 7B:
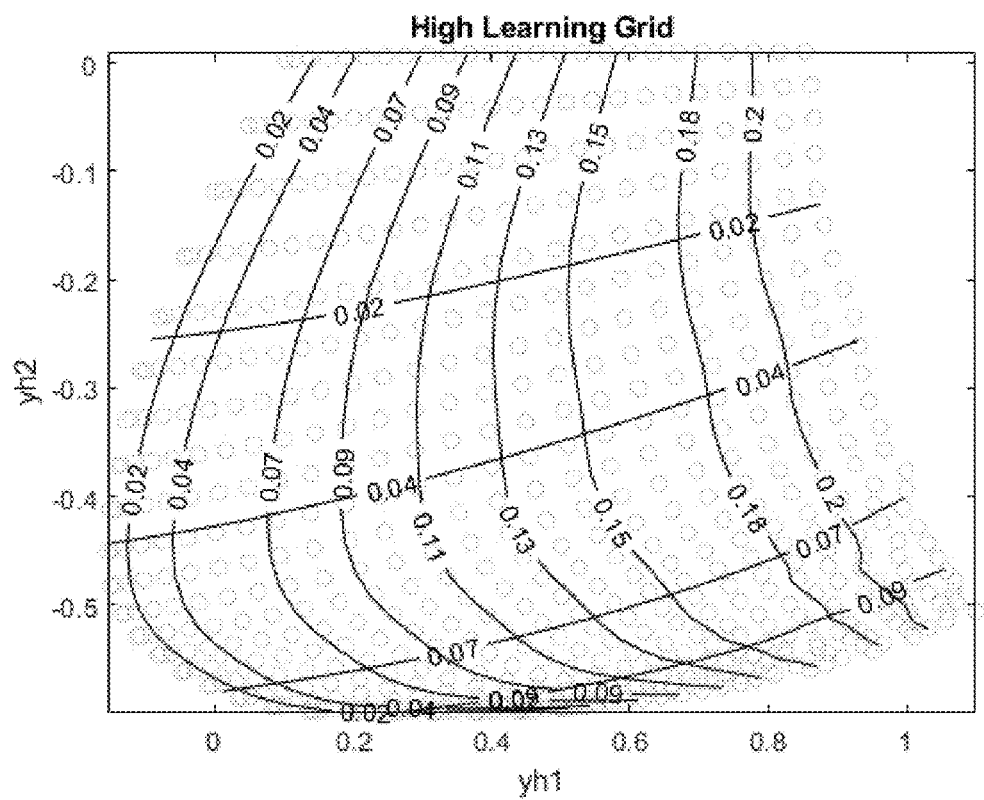

If these features on plotted on a graph where each grid point indicates a particular generated signal of a known frequency and bandwidth, a pair of distorted nonlinear 2-D grids would be created. This is shown for an example filter pair in FIGS. 7A and 7B. FIGS. 7A and 7B are graphs respectively showing low and high learning grids consisting of a grid of points which respectively indicate a particular generated signal of a known frequency and bandwidth in accordance with one proposed implementation. Overlaid on these grids are contours showing both frequency offset and bandwidths. By creating a 2-D lookup table with interpolation for frequency offset and a 2-D lookup table with interpolation for bandwidth, the system has in effect learned an approximation that takes filter values and produces important parameters of interest. Example implementations of a 2-D interpolating lookup table are described below with reference to FIGS. 9 and 10.

Next, the concepts underlying the feature vectors will be described. The basic idea is to create simply computed independent features that are roughly related to the parameters of interest (namely center frequency and bandwidth) and then use machine learning to make a more direct connection to those parameters. As described in more detail below, the second features $(y_{lo2}, y_{hi2})$ are produced by the windowed sum of the product of the two filtered signals $(x_{lo}, x_{hi})$ divided by the windowed sum of the squared sum of their amplitudes. This is then related to a measure of frequency offset because it is essentially the least square solution of the best scalar estimate of $\pm(x_{hi}-x_{lo})/(x_{hi}+x_{lo})$, which essentially measures the overall normalized difference in time between the two signals and this in turn is related to their frequency difference since the closer they are in frequency, the closer this normalized difference is to zero.

The first features $(y_{lo1}, y_{hi1})$ are based on creating a complex signal from the low filter and a complex signal from the high filter through an approximate I, Q process. However, instead of mixing against a sine and cosine of the appropriate center frequency (as the I, Q process would do), a simple interpolated delay is used, based on the center frequency $f_0$ of the filter pair. Then each of the two complex signals is inverted and mixed against the other. This creates two complex signals that represent roughly their low-to-high frequency difference and their high-to-low frequency difference. Then the second feature is subtracted/added so that a rough frequency difference is zeroed out. Thus, these complex signals should essentially be nearly constant (and have nearly zero variance) if a zero bandwidth single tone is present. By contrast, when wider bandwidth signals are present, the variance (or standard deviation) of these complex signals is then related to a measure of bandwidth.

Note that these features are not directly frequency offset and bandwidth; that is where the learning takes place through feature generation that trains interpolating lookup tables. Mathematically, the feature vector formation process may be described as follows. First, the construction of a complex signal is approximated through simple delays and interpolation, leading to the complex mixed signal $$z = (x_{lo} + i\widehat{x_{lo}})/(x_{hi} + i\widehat{x_{hi}}) \qquad (9)$$

where $$\widehat{x_{lo}}(n) = (1-r)x_{lo}(n-d) + rx_{lo}(n-d+1) \qquad (10)$$

and similarly for $\widehat{x_{hi}}$. Here $$r = \text{rem}\left(\frac{1}{f_0}, 1\right) \text{ and } d = \left\lfloor \frac{1}{f_0} \right\rfloor$$

and all frequencies are in normalized form from 0 to 1. Also $$y_{lo2} = \Sigma_W(x_{hi}x_{lo})/\Sigma_W(x_{hi}^2 + x_{lo}^2) \qquad (11)$$

Then $$y_{lo1} = std_W(\text{real}(z)) + std_W(\text{imag}(z)) + y_{lo2} \qquad (12)$$

where the function "std" denotes the standard deviation of the sample within a sliding time window W. In a similar manner, the parameters $(y_{hi1}, y_{hi2})$ may be defined by switching the roles of $x_{hi}$ and $x_{lo}$ in Eqs. (9)-(12).

The step-by-step process shown FIG. 6 will now be explained described in more detail:

1. The inputs to the process are the outputs $x_{lo}$ and $x_{hi}$ from the low and high filters.

2. An approximate complex baseband version of each signal is created $((x_{lo}+i\widehat{x_{lo}})$ and $(x_{hi}+i\widehat{x_{hi}}))$ before inversion and complex multiplication. The imaginary part must be created from a delayed and interpolated version of the original signal as given in Eq. (10) for the low channel. Here delay $nf_0$ is the number of sample delays represented by d and the other delay is a single sample delay.

3. Each low and high filter channel has an approximate complex signal having real and imaginary parts which are sent along lines labeled "real" and "imag" that lead to each of the complex multipliers 36 and 56.

(a) The complex signal is sent to a complex multiplier which multiplies it with the complex inverse of the other channel.

(b) The complex signal is sent to a complex inverse lookup table 37 or 57 to compute the complex inverse that is used by the complex multiplier in the opposite channel.

(c) The real part of the complex signal (the original filter output) is sent to a squaring circuit 38 or 58 and then summed over a window of samples to produce $\Sigma_W(x_{hi}^2 + x_{lo}^2)$.

(d) Lastly, the original real signals $x_{lo}$ and $x_{hi}$ are also sent to a multiplier 44 and then window summed to produce $\Sigma_W(x_{hi}x_{lo})$ before computing the final ratio for the outputs $y_{lo2}$ and $y_{hi2}$ (where the sign is inverted).

4. Then the real and imaginary parts of the two complex channels $(x_{lo}+i\widehat{x_{lo}})/(x_{hi}+i\widehat{x_{hi}})$ and $(x_{hi}+i\widehat{x_{hi}})/(x_{lo}+i\widehat{x_{lo}})$ have their standard deviations computed in a windowed fashion and summed before outputting $y_{lo1}$ and $y_{hi1}$.

Figure 6:
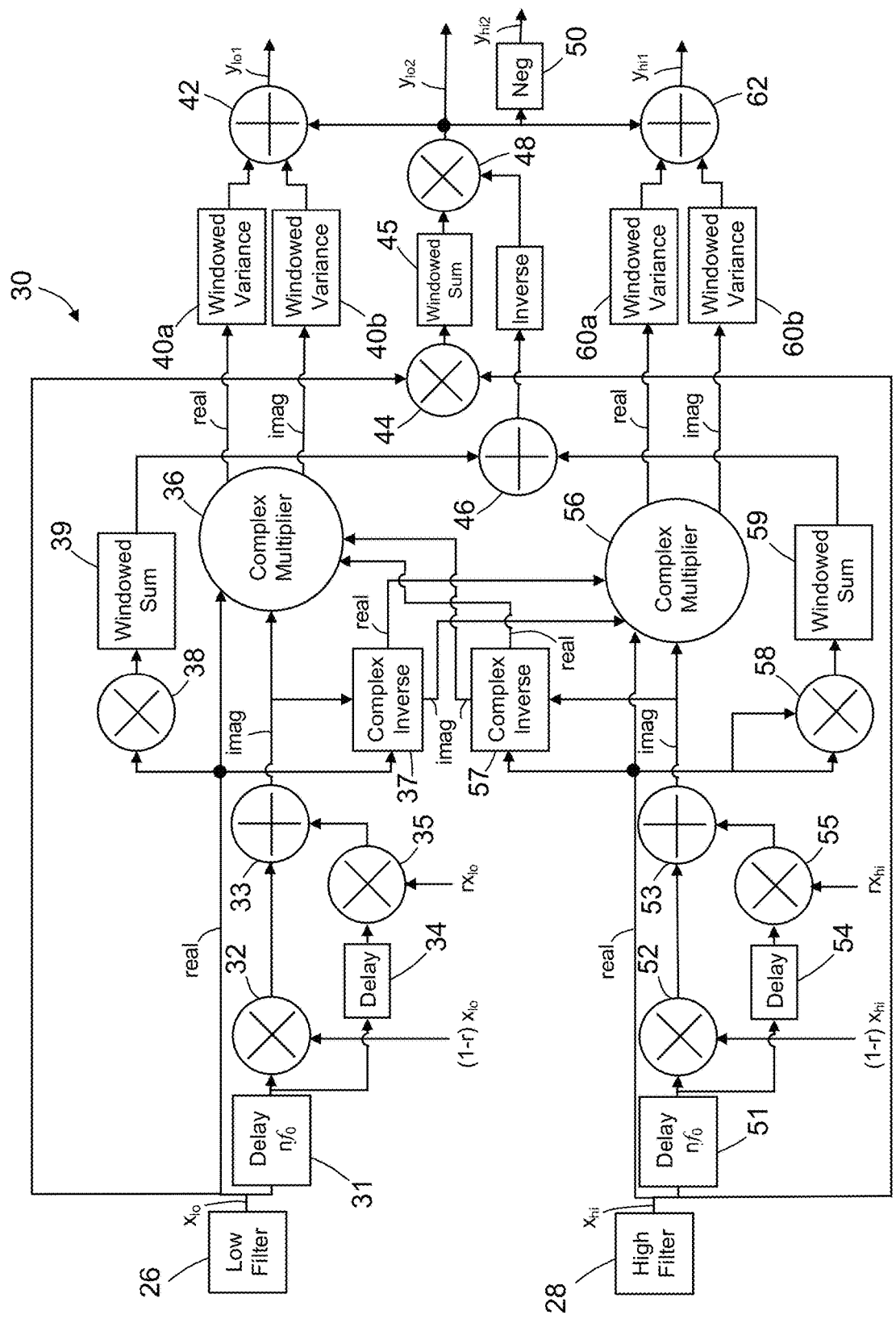
FIG. 6 is a flowchart identifying steps (signal processing operations) of a method for cueing frequency and bandwidth estimation in accordance with one embodiment.

To comply with the requirement that all numbered elements in a drawing be described in the specification, the following more detailed description of the methodology depicted in FIG. 6 is provided.

The low filter output $x_{lo}$ is processed in five different ways. First, the low filter output $x_{lo}$ is the real part input to a complex multiplier 36. Second, the low filter output $x_{lo}$ is delayed by a time $nf_0$ (step 31), which delayed value is further processed (as explained below) to produce the complex part which is input to complex multiplier 36. Third, the amplitude of the low filter output $x_{lo}$ is squared by the squaring circuit 38. Fourth, the low filter output $x_{lo}$ is mixed with the high filter output $x_{hi}$ to from their product (step 44). Fifth, the low filter output $x_{lo}$ is input to the complex inversion lookup table 37.

The delayed low filter output $x_{lo}$ is processed in two ways to derive an imaginary part. First, the delayed low filter output $x_{lo}$ is mixed with parameter $(1-r)x_{lo}$ (step 32) Second, the delayed low filter output $x_{lo}$ is further delayed (step 34), which further delayed value is mixed with parameter $rx_{lo}$ (step 35). The results of mixing steps 32 and 35 are then summed (step 33) to form an imaginary part which is sent to complex multiplier 36. The real and imaginary parts are also complex inverted by the complex inversion lookup table 37 and sent to complex multiplier 56.

The complex multiplier 36 outputs real and complex parts of a complex number (see Eq. (9) below). Those real and imaginary parts are respectively received by windowed variance circuits 40a and 40b, which compute the standard deviation of the samples within a sliding window (see Eq. (12) below).

Likewise, the high filter output $x_{hi}$ is processed in five different ways. First, the high filter output $x_{hi}$ is the real part input to the complex multiplier 56. Second, the high filter output $x_{hi}$ is delayed by a time $nf_0$ (step 51), which delayed value is further processed (as explained below) to produce a complex part which is input to complex multiplier 56. Third, the high filter output $x_{hi}$ is squared by the squaring circuit 58. Fourth, the high filter output $x_{hi}$ is mixed with the low filter output $x_{hi}$ to from their product (step 44). Fifth, the high filter output $x_{hi}$ is input to the complex inversion lookup table 57.

The delayed high filter output $x_{hi}$ is processed in two ways to derive an imaginary part. First, the delayed high filter output $x_{hi}$ is mixed with parameter $(1-r)x_{hi}$ (step 52). Second, the delayed high filter output $x_{hi}$ is further delayed (step 54), which further delayed value is mixed with parameter $rx_{hi}$ (step 55). The results of mixing steps 52 and 55 are then summed (step 53) to form an imaginary part which is sent to complex multiplier 56. The real and imaginary parts are also complex inverted by the complex inversion lookup table 57 and sent to complex multiplier 36.

The complex multiplier 56 outputs real and complex parts of a complex number. Those real and imaginary parts are respectively received by windowed variance circuits 60a and 60b, which compute the standard deviation of the samples within a sliding window.

Still referring to FIG. 6, it can be seen that the low filter output $x_{lo}$ and the high filter output $x_{hi}$ are mixed (step 44), while squaring circuit 38 forms the square of the amplitude of low filter output $x_{lo}$ and squaring circuit 58 forms the square of the amplitude high filter output $x_{hi}$. The outputs of windowed sum circuits 39 and 59 are summed (step 46) and then inverted (step 47). The outputs of the mixer that performs step 44 and the inverter that performs step 47 are then mixed (step 48) to form parameter $y_{lo2}$ (see Eq. (11)). The windowed variances output by windowed variance circuits 40a and 40b and the parameter $y_{lo2}$ are summed (step 42) to form the parameter $y_{lo1}$. The windowed variances output by windowed variance circuits 60a and 60b and the parameter $y_{lo2}$ are summed (step 62) to form the parameter $y_{hi1}$. The sign of parameter $y_{lo2}$ is reversed (step 50) to form the parameter $y_{hi2}$.

Signal Tracking Lookup Table for Filter Coefficients

A tunable filter, such as the tracking filter in an SST channel, requires updating filter coefficients. To do this quickly, a lookup table method is required. U.S. Pat. No. 9,954,561 discloses an embodiment in which the filter module implements an interpolation process to enable determination of the final values of filter coefficients α and β to provide the updates within two hardware clock cycles. The updated center frequency and bandwidth signal contained at least one of a frequency word and a bandwidth word including a frequency value and a bandwidth value, respectively. Substantially simultaneously with transmission of the updated center frequency and bandwidth signal from the BSS channel state machine module, the tracking algorithm used a lookup and interpolation routine with a table of fixed coefficients stored in memory to determine the updated filter coefficient values α and β by interpolation of the values from the table of fixed coefficients queried with the updated value of the frequency word and/or bandwidth word. Also, substantially simultaneously with the lookup and interpolation routine, a set of values of filter coefficients α and β were updated in memory to enable subsequent cycles of lookup, interpolation, and update of filter coefficients α and β for subsequent instances of filter input signal. Thus, in two hardware clock cycles, the filter module enabled the signal processing system to quickly and adaptively track quickly changing incoming radar signals (e.g., broad band chirps) without glitches as fast as the updated center frequency and bandwidth signal is transmittable from the BSS channel state machine module, and to switch between radar signals at widely separated frequencies in real time.

The interpolation lookup table described in U.S. Pat. No. 9,954,561 had a single input, namely, frequency. However, to tune for both frequency and bandwidth requires a two-input interpolating lookup table. A two-input interpolating lookup table in accordance with one proposed implementation is described below with reference to FIGS. 9 and 10.

The tracking filter disclosed in U.S. Pat. No. 9,954,561 used frequency as its only input parameter for adjusting the coefficients of a second-order IIR filter. In the approach described herein with the SST channel, both frequency and bandwidth need to be used to both track in frequency and bandwidth. For example, with a triple pipelined second-order IIR filter, there would need to be nine 2-D interpolating lookup tables.

Signal Tracking Lookup Table for Threshold

The threshold T controls the starting and stopping of signal tracking in the SST channel 20. Specifically, the SST channel 20 determines whether a signal is present in the tracking filter or not by estimating the SNR and when SNR is above a certain threshold T for reliable tracking, a signal is declared present. If r=S/N (the SNR, where S is the signal energy and N is noise), then $$S/(S+N)=r/(r+1).$$

Assuming a window of time t, take E(y) to be the estimated signal energy S over that time, i.e., signal power. The cueing filters must contain both signal and noise with energy (S+N) over time t. The signal energy S will be overestimated because the only measurements from the filter energies $E(y_{lo})$ and $E(y_{hi})$ contain a certain amount of overlap. Taking the filter responses and overlaps and the frequency and bandwidth (f, w) of the signal into account for a fixed value of r, a single parametric function $T=T_r(f, w)$ can be learned for each filter pair in the cueing system and each frequency and bandwidth value through an offline learning step like the previous one for frequency and bandwidth. From this, a lookup table can be created so that it is approximately true that $$E(y)/(E(y_{lo})+E(y_{hi})) \approx T_r(f,w)$$

for an SNR value r. Therefore, a value of r can be chosen as the operating SNR level for the SST channel and a single two-input lookup table (with optional interpolation as shown below) can be created to regulate the starting and stopping of tracking in the SST channel at the correct operating SNR level. The implementation of this table on an FPGA or ASIC is described below.

Signal Separation and Tracking State Machine

Figure 8:
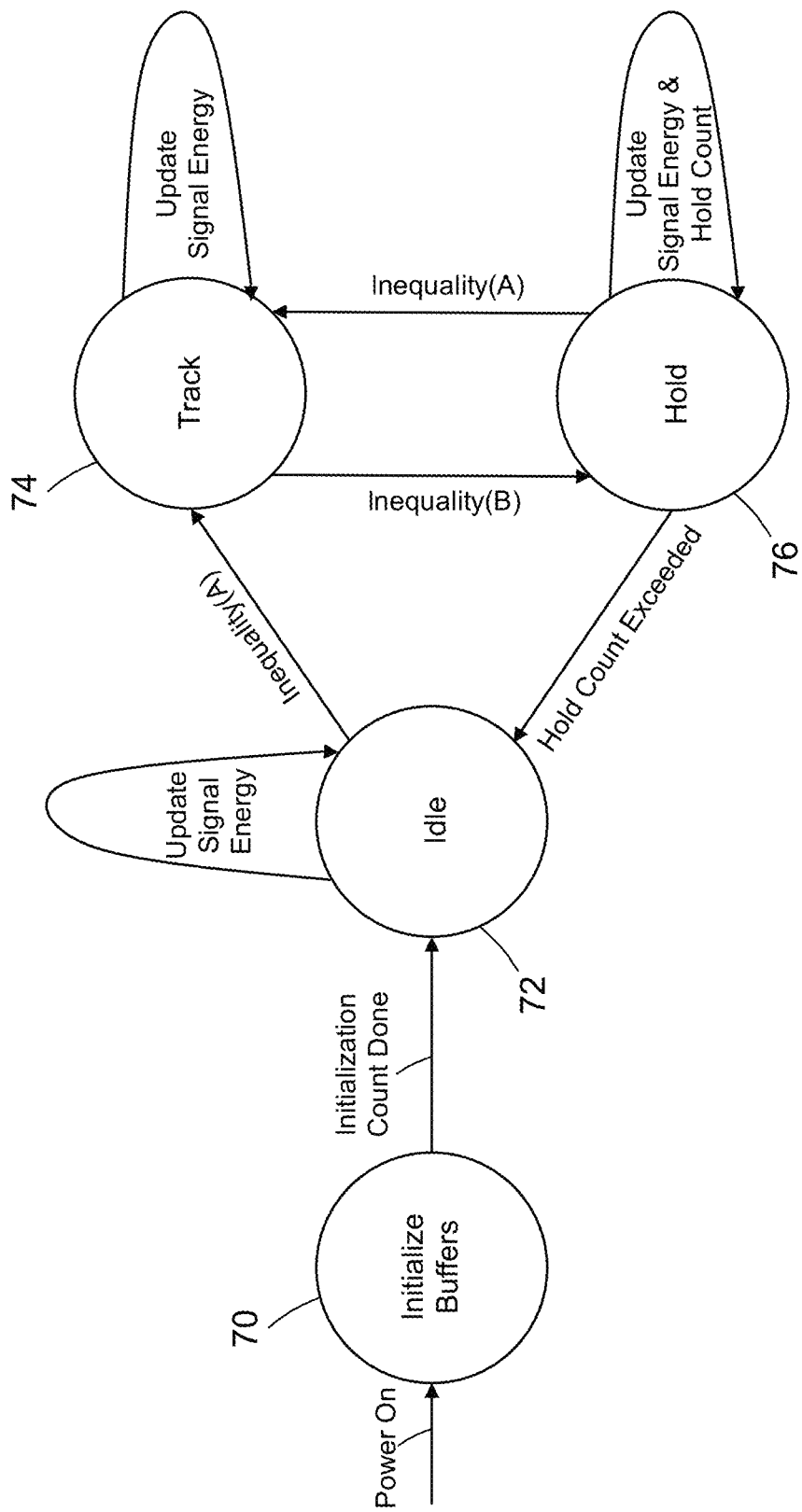
FIG. 8 is a state diagram showing the states of an SST channel state machine in accordance with one embodiment.

FIG. 8 is a state diagram showing the states of an SST channel state machine 14 in accordance with one embodiment. The architecture for the SST channel state machine 14 has the following four states: (i) Power On/Initialize Buffers state 70; (ii) Idle state 72; (iii) Track state 74; and (iv) Hold state 76. The state machine generally moves through the states in the order 70→72→74→76→72 as shown in FIG. 8. Each of these states is described in detail below.

(i) Power On/Initialize Buffers State: The buffers and registers in the various parts of the SST channel 20 are initialized at power-on.

(ii) Idle State: A sliding window (buffer) of filtered signal samples for each of y, $y_{lo}$, and $y_{hi}$ is squared and summed. The average energy of each (E(y), $E(y_{lo})$, $E(y_{hi})$), which is the windowed sum divided by the window length, are used to compare the current filtered signal energy E(y) with the threshold T, which is a function of (f, w) as:

$$E(y)>T_r(f,w)*(E(y_{lo})+E(y_{hi})).\quad\text{(A)}$$

When this inequality is met, the Idle state 72 transitions (switches) to the Track state 74.

(iii) Track State: When the Track state 74 starts, a PDW resource enable signal is sent, allocating PDW generation resources that consume the output of the signal separator. While in the Track state 74, the current filtered signal energies E(y), $E(y_{lo})$, $E(y_{hi})$ are updated and compared and when $$E(y) \leq T_r(f,w)*(E(y_{lo})+E(y_{hi})),\quad\text{(B)}$$

the Track state 74 transitions to the Hold state 76.

(iv) Hold State: When the Hold state 76 starts, the hold count is zeroed and starts incrementing. At the same time, the signal energy is updated and compared as before. If $$E(y)>T_r(f,w)*(E(y_{lo})+E(y_{hi})).\quad\text{(A)}$$

then the Hold state 76 is changed back to the Track state 74. Otherwise, if the count exceeds the hold count threshold, the PDW resource disable signal is sent and the Hold state 76 transitions back to the Idle state 72.

Two-Input Interpolating Lookup Table

In order to capture the learned filter response for a pair of cueing filters in a specific hardware implementation, a two-input interpolating lookup table is employed. In accordance with various proposed implementations, this may be done using memory elements in an ASIC or a FPGA. One implementation in a specifically sized block random access memory (BRAM) in a standard commercial FPGA will now be described, but a practitioner with ordinary skill in this technological area could translate this example specific memory element to a more general memory element with other sizes. As used herein, the term "memory element" means an element of a non-transitory tangible computer-readable storage medium.

Block random access memories (BRAMs) are used for storing large amounts of data inside of an FPGA. Typically, the FPGA also includes flip-flops, lookup tables, and digital signal processors. In one example implementation (schematically represented in FIG. 9), a standard 512×36 BRAM 82 (hereinafter "BRAM 82") was used as a single memory interpolating element in a register array 80*a*; in another example implementation (schematically represented in FIG. 10), two 1024×18 BRAMs 82*a* and 82*b* (hereinafter "BRAMs 82*a* and 82*b*") were used to construct a register array 80*b*.

In order to implement an interpolating lookup table for two inputs, the standard linear interpolation equation $$f=(1-f_{lo})*R_{lo}[f_{hi}]+f_{lo}*R_{hi}[f_{hi}]\quad(13)$$

is reworked. For that purpose, assume that the table will produce a single interpolated output R (for example, an order-2 IIR filter would need five of these interpolating lookup tables for filter coefficients $\beta_1$, $\beta_2$, $\beta_3$ and $\alpha_2$, $\alpha_3$). The input bits are split into high and low values $f_{hi}(n)$, $f_{lo}(n)$, $w_{hi}(n)$, and $w_{lo}(n)$, where these are the n-th values in the memory array. And the output bits are split into four output values $R_{ll}(n)$, $R_{lh}(n)$, $R_{hl}(n)$, and $R_{hh}(n)$. These correspond to the input values for the four corners of the input rectangle $\{(f_{hi}(n), w_{hi}(n)), (f_{hi}(n+1), w_{hi}(n)), (f_{hi}(n), w_{hi}(n+1)), (f_{hi}(n+1), w_{hi}(n+1))\}$. Then (dropping the n for clarity) the interpolated output becomes:

$$R=(1-f_{lo})(1-w_{lo})*R_{ll}+f_{lo}(1-w_{lo})*R_{hl}+(1-f_{lo})w_{lo}*R_{lh}+f_{lo}w_{lo}*R_{hh}$$

The standard equation can be rewritten to reduce the number of multipliers from 7 down to 4 as shown below:

$$R=f_{lo}*w_{lo}*(R_{ll}-R_{h}-R_{lh}-R_{hh})+w_{lo}*(R_{lh}-R_{ll})+f_{lo}*(R_{hl}-R_{ll})+R_{ll}\quad(14)$$

Figure 9:
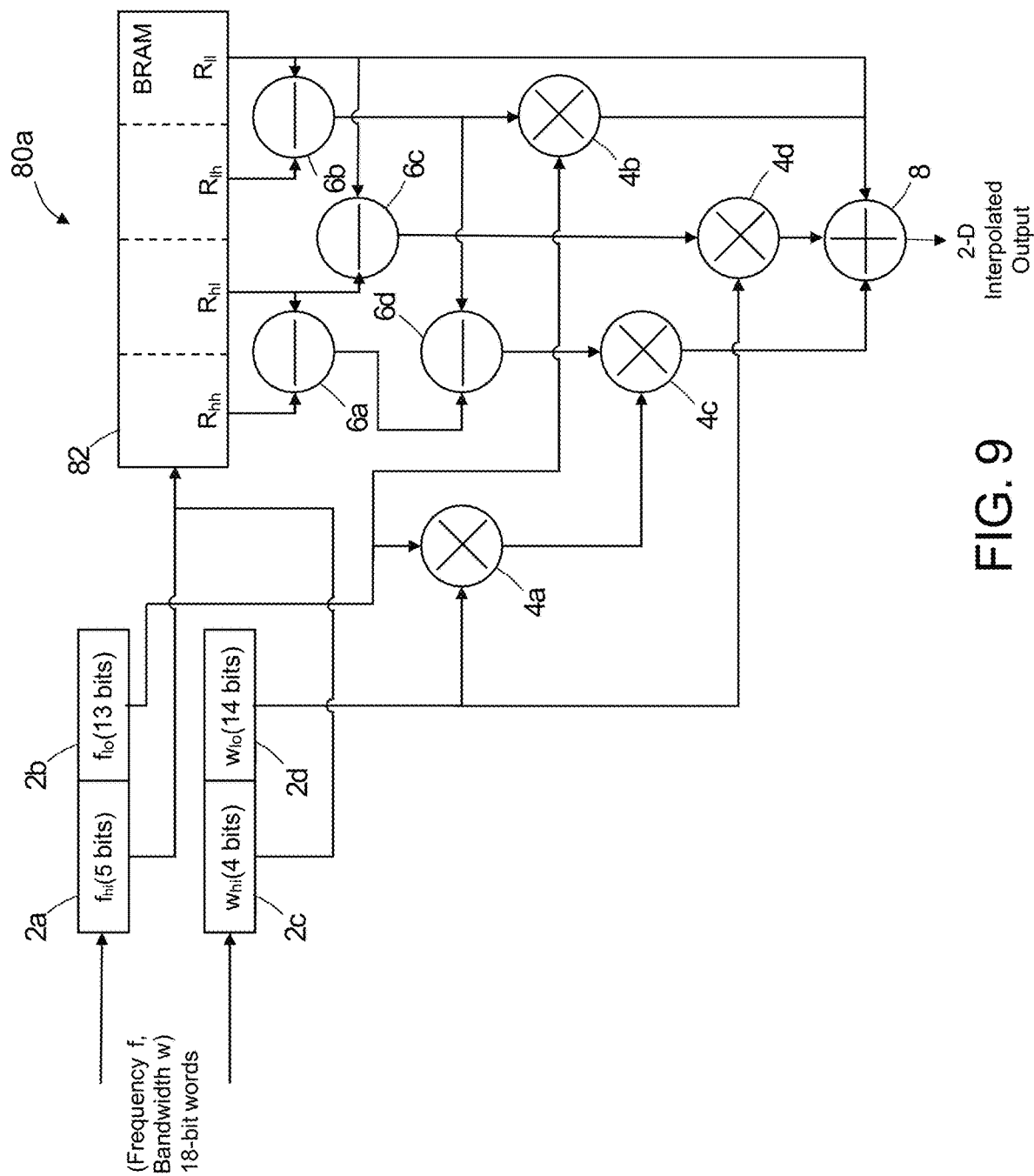
FIG. 9 is a diagram representing interpolation being performed by a two-input interpolating lookup table stored in a 512×36-bit BRAM in accordance with one embodiment.
Figure 10:
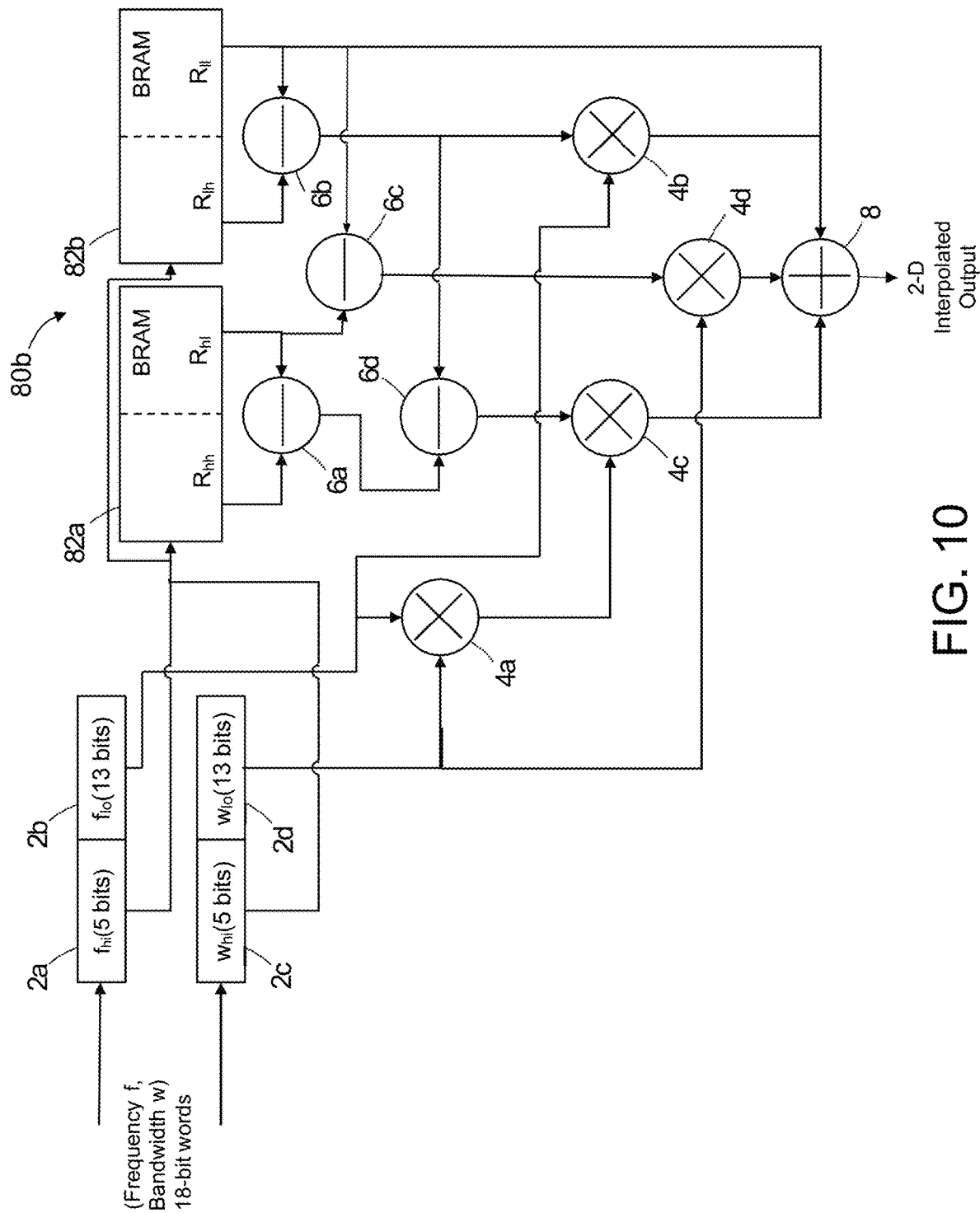
FIG. 10 is a diagram representing interpolation being performed by a two-input interpolating lookup table stored in a dual 1024×18-bit BRAM in accordance with one embodiment.

This is shown in FIG. 9 for the register array 80*a* having a single 512×36-bit BRAM 82 and in FIG. 10 for the register array 80b having dual 1024×18-bit BRAMs 82a and 82b. Many other options are possible depending on the number of bits needed and array sizes.

Referring now to FIG. 9, the frequency $f_{hi}$ (a five-bit value) is stored in an equal number of data storage elements 2a, while the frequency $f_{lo}$ (a 13-bit value) is stored in an equal number of data storage elements 2b. Similarly, the bandwidth $w_{hi}$ (a four-bit value) is stored in an equal number of data storage elements 2c, while the bandwidth $w_{lo}$ (a 14-bit value) is stored in an equal number of data storage elements 2d. The frequency $f_{lo}$ is sent from data storage elements 2b to multipliers 4a and 4b; the bandwidth $w_{lo}$ is sent from data storage elements 2d to multipliers 4a and 4d. The multiplier 4a outputs the product $f_{lo}*w_{lo}$ to multiplier 4c. At the same time, frequency $f_{hi}$ and bandwidth $w_{hi}$ are output from data storage elements 2a and 2c and input to BRAM 82. In response to these inputs, the respective values $R_{hh}$, $R_{hl}$, $R_{lh}$, and $R_{ll}$ are read out of BRAM 82. The subtracter 6a outputs the value $(R_{hh}-R_{hl})$; the subtracter 6b outputs the value $(R_{lh}-R_{ll})$; subtracter 6c outputs the value $(R_{hl}-R_{ll})$; and subtracter 6d outputs the value $(R_{ll}-R_{hl}-R_{lh}-R_{hh})$. The multiplier 4c outputs a value corresponding to the computed first term in Eq. (14); multiplier 4d outputs a value corresponding to the computed second term in Eq. (14); and multiplier 4b outputs a value corresponding to the computed third term in Eq. (14). Finally, the summer 8 sums the output values from multipliers 4a-4c and the output value $R_{ll}$ from BRAM 82 to form the 2-D interpolated value R (which has been computed in accordance with Eq. (14)).

The implementation depicted in FIG. 10 differs from the implementation depicted in FIG. 9 in that the $R_{hh}$ and $R_{hl}$ values are stored in a first BRAM 82a, while the $R_{lh}$ and $R_{ll}$ values are stored in a second BRAM 82b. The frequency $f_{hi}$ and bandwidth $w_{hi}$ are output from data storage elements 2a and 2c and input to both BRAMs 82a and 82b concurrently.

In summary, notable features of the technology described above include the following: (1) more accurate fast estimation of frequency and bandwidth than other real-time methods; (2) lower latency estimates than any other methods known to the inventor; (3) real-time operation using windowed methods that provide rapid updating as the signal environment changes; (4) simpler than other methods using less hardware and thus less size, weight or power; (5) implementable in a streaming ASIC or FPGA using a high-speed data flow architecture; and (6) innovative multi-dimensional interpolating lookup table with very low latency. These provide benefits including quicker detection and tracking of signals, better detection and tracking of low-SNR signals, better signal separation and characterization, and better overall receiver performance (i.e., better overall signal parameter estimation).

While systems and methods for estimating frequency and bandwidth of unknown signals using a learned filter pair response have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The embodiments disclosed above use one or more processing or computing devices. Such devices typically include a processor, processing device, or controller, such as a general-purpose central processing unit, a microcontroller, a reduced instruction set computer processor, an ASIC, a programmable logic circuit, an FPGA, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a processing device, cause the processing device to perform at least a portion of the methods described herein.

The invention claimed is:

1. A method for estimating frequency and bandwidth of signals, the method comprising:
    transducing electromagnetic radiation carrying a repetitive signal into an analog electrical signal;
    converting the analog electrical signal into signal samples;
    inputting the signal samples to first and second filters having partially overlapping bandwidths that include a frequency range bounded by lower- and upper-bound frequencies and having a center frequency;
    outputting first filtered signal samples from the first filter and second filtered signal samples from the second filter in response to inputting the signal samples;
    processing the first and second filtered signal samples to generate frequency/bandwidth digital data representing an estimated frequency and an estimated bandwidth of the repetitive signal;
    generating filter coefficients for a tunable filter which are functions of the estimated frequency and the estimated bandwidth;
    tuning the tunable filter in accordance with the filter coefficients;
    inputting the signal samples to the tunable filter after tuning;
    outputting filtered signal samples from the tunable filter after tuning and in response to inputting the signal samples; and
    processing the filtered signal samples from the tunable filter to generate pulse descriptor words comprising respective data sets of parameter values of the repetitive signal, wherein each data set of parameter values making up a pulse descriptor word comprises amplitude, time of arrival, and frequency.

2. The method as recited in claim 1, wherein the first filter has a center frequency equal to the lower-bound frequency and the second filter has a center frequency equal to the upper-bound frequency.

3. The method as recited in claim 1, further comprising identifying a source of the repetitive signal based on the data sets of parameter values.

4. The method as recited in claim 1, further comprising directing movement of a vehicle based on the data sets of parameter values.

5. A method for estimating frequency and bandwidth of signals, the method comprising:
    creating first and second 2-D lookup tables which store frequency offsets and third and fourth 2-D lookup tables which store bandwidths;
    transducing electromagnetic radiation carrying a repetitive signal into an analog electrical signal;
    converting the analog electrical signal into signal samples;
    inputting the signal samples to first and second filters having partially overlapping bandwidths that include a frequency range bounded by lower- and upper-bound frequencies and having a center frequency;

outputting first filtered signal samples from the first filter and second filtered signal samples from the second filter in response to inputting the signal samples;
processing the first and second filtered signal samples to generate frequency/bandwidth digital data representing an estimated frequency and an estimated bandwidth of the repetitive signal;
generating filter coefficients for a tunable filter which are functions of the estimated frequency and the estimated bandwidth;
tuning the tunable filter in accordance with the filter coefficients; and
inputting the signal samples to the tunable filter after tuning,
wherein the processing step comprises:
computing first through fourth feature vectors based on the first and second filtered signal samples;
inputting the first and second feature vectors into the first and third 2-D lookup tables;
inputting the third and fourth feature vectors into the second and fourth 2-D lookup tables;
outputting an estimated lower frequency offset and an associated estimated bandwidth from the first and third 2-D lookup tables in response to inputting the first and second feature vectors;
estimating a lower frequency by adding the center frequency to the estimated lower frequency offset;
outputting an estimated upper frequency offset and an associated estimated bandwidth from the second and fourth 2-D lookup tables in response to inputting the third and fourth feature vectors;
estimating an upper frequency by adding the center frequency to the upper frequency offset;
selecting either the estimated lower frequency or the estimated upper frequency; and
outputting a signal representing the selected estimated frequency and the associated estimated bandwidth.

6. The method as recited in claim 5, further comprising:
outputting filtered signal samples from the tunable filter after tuning and in response to inputting the digital signal samples.

7. The method as recited in claim 5, further comprising generating a two-input lookup table that stores values for one of the filter coefficients, wherein generating filter coefficients for the tunable filter comprises inputting the selected estimated frequency and the associated estimated bandwidth into the two-input lookup table.

8. The method as recited in claim 5, wherein creating first through fourth 2-D lookup tables comprises training filter responses using machine learning by creating a grid of training data based on example signal samples that cover a span of frequencies and bandwidths.

9. The method as recited in claim 5, wherein the first filter has a center frequency equal to the lower-bound frequency and the second filter has a center frequency equal to the upper-bound frequency.

10. A system for processing repetitive signals, the system comprising:
a sensor configured to transduce electromagnetic radiation carrying a repetitive signal into an analog electrical signal;
an analog-to-digital converter configured to convert the analog electrical signal into signal samples;
a signal frequency/bandwidth estimator comprising first and second filters connected to receive the signal samples and signal processing circuitry configured to process filtered signal samples from the first and second filters to generate frequency/bandwidth digital data representing an estimated frequency and an estimated bandwidth of the repetitive signal, wherein the first and second filters have partially overlapping bandwidths that include a frequency range bounded by lower- and upper-bound frequencies and having a center frequency;
a signal separation and tracking channel comprising a tunable filter connected to receive the signal samples and configured to filter the signal samples using filter coefficients which are a function of the estimated frequency and estimated bandwidth; and
a pulse descriptor word generator connected to receive filtered signal samples from the tunable filter and configured to process the filtered signal samples from the tunable filter to generate pulse descriptor words comprising respective data sets of parameter values of the repetitive signal, wherein each data set of parameter values making up a pulse descriptor word comprises amplitude, time of arrival, and frequency.

11. The system as recited in claim 10, wherein the first filter has a center frequency equal to the lower-bound frequency and the second filter has a center frequency equal to the upper-bound frequency.

12. A system for processing repetitive signals, the system comprising:
a sensor configured to transduce electromagnetic radiation carrying a repetitive signal into an analog electrical signal;
an analog-to-digital converter configured to convert the analog electrical signal into signal samples;
a signal frequency/bandwidth estimator comprising first and second filters connected to receive the signal samples and signal processing circuitry configured to process filtered signal samples from the first and second filters to generate frequency/bandwidth digital data representing an estimated frequency and an estimated bandwidth of the repetitive signal, wherein the first and second filters have partially overlapping bandwidths that include a frequency range bounded by lower- and upper-bound frequencies and having a center frequency; and
a signal separation and tracking channel comprising a tunable filter connected to receive the signal samples and configured to filter the signal samples using filter coefficients which are a function of the estimated frequency and estimated bandwidth,
wherein the signal processing circuitry comprises:
a feature vector computation module configured to compute first through fourth feature vectors based on first and second filtered signal samples respectively out by the first and second filters;
a first 2-D lookup table which is connected to receive the first and second feature vectors from the feature vector computation module and configured to store frequency offsets and output an interpolated frequency offset based on the first and second feature vectors; and
a first adder connected to add the center frequency to an interpolated frequency offset output by the first 2-D lookup table to generate an estimated lower frequency.

13. The system as recited in claim 12, wherein the signal processing circuitry further comprises:
a second 2-D lookup table which is connected to receive the third and fourth feature vectors from the feature vector computation module and configured to store frequency offsets and output an interpolated frequency offset based on the third and fourth feature vectors; and a second adder connected to add the center frequency to an interpolated frequency offset output by the second 2-D lookup table to generate an estimated upper frequency.

14. The system as recited in claim 13, further comprising:
a third 2-D lookup table which is connected to receive the first and second feature vectors from the feature vector computation module and configured to store bandwidths and output an interpolated bandwidth based on the first and second feature vectors; and
a fourth 2-D lookup table which is connected to receive the third and fourth feature vectors from the feature vector computation module and configured to store bandwidths and output an interpolated bandwidth based on the third and fourth feature vectors.

15. The system as recited in claim 14, further comprising a decision circuit that selects one of the estimated lower and upper frequencies and an associated estimated depending on whether a windowed sum squared of the output of the first filter is less or more than a windowed sum squared of the output of the second filter.

16. The system as recited in claim 15, wherein the signal separation and tracking channel further comprises a two-input filter coefficient lookup table which is connected to receive the selected estimated frequency and bandwidth and configured to store values of a filter coefficient and output a value of the first filter coefficient value which is dependent on the selected estimated frequency and bandwidth for use in tuning the tunable filter.

17. The system as recited in claim 12, wherein the first filter has a center frequency equal to the lower-bound frequency and the second filter has a center frequency equal to the upper-bound frequency.

18. A signal cueing system comprising:
first and second filters connected to receive signal samples of a repetitive signal and configured to output filtered signal samples, wherein the first and second filters have partially overlapping bandwidths that include a frequency range bounded by lower- and upper-bound frequencies and having a center frequency; and
signal processing circuitry configured to process filtered signal samples from the first and second filters to generate frequency/bandwidth digital data representing an estimated frequency and an estimated bandwidth of the repetitive signal,
wherein the signal processing circuitry comprises:
a feature vector computation module configured to compute first through fourth feature vectors based on first and second filtered signal samples respectively out by the first and second filters;
a first 2-D lookup table which is connected to receive the first and second feature vectors from the feature vector computation module and configured to store frequency offsets and output an interpolated frequency offset based on the first and second feature vectors;
a first adder connected to add the center frequency to an interpolated frequency offset output by the first 2-D lookup table to generate an estimated lower frequency;
a second 2-D lookup table which is connected to receive the third and fourth feature vectors from the feature vector computation module and configured to store frequency offsets and output an interpolated frequency offset based on the third and fourth feature vectors; and
a second adder connected to add the center frequency to an interpolated frequency offset output by the second 2-D lookup table to generate an estimated upper frequency.

19. The system as recited in claim 18, further comprising:
a third 2-D lookup table which is connected to receive the first and second feature vectors from the feature vector computation module and configured to store bandwidths and output an interpolated bandwidth based on the first and second feature vectors; and
a fourth 2-D lookup table which is connected to receive the third and fourth feature vectors from the feature vector computation module and configured to store bandwidths and output an interpolated bandwidth based on the third and fourth feature vectors.

20. The system as recited in claim 19, further comprising a decision circuit that selects one of the estimated lower and upper frequencies and an associated estimated depending on whether a windowed sum squared of the output of the first filter is less or more than a windowed sum squared of the output of the second filter.

* * * * *